(12) United States Patent
Kim

(10) Patent No.: US 8,271,823 B2
(45) Date of Patent: *Sep. 18, 2012

(54) DLL PHASE DETECTION USING ADVANCED PHASE EQUALIZATION

(75) Inventor: Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 591 days.

This patent is subject to a terminal disclaimer.

(21) Appl. No.: 12/228,771

(22) Filed: Aug. 15, 2008

(65) Prior Publication Data

US 2008/0320325 A1    Dec. 25, 2008

Related U.S. Application Data

(63) Continuation of application No. 10/848,261, filed on May 18, 2004, now Pat. No. 7,421,606.

(51) Int. Cl.
*G06F 1/12* (2006.01)
*G06F 13/42* (2006.01)

(52) U.S. Cl. ........ 713/401; 713/400; 713/600; 713/601; 327/141; 327/146; 327/162; 375/226; 375/227

(58) Field of Classification Search .................. 713/400, 713/401, 500, 600, 601; 327/141, 146, 162; 375/226, 227

See application file for complete search history.

(56) References Cited

U.S. PATENT DOCUMENTS

| | | | |
|---|---|---|---|
| 4,390,801 A | 6/1983 | Kurata et al. | |
| 5,118,975 A | 6/1992 | Hillis et al. | |
| 5,272,729 A | 12/1993 | Bechade et al. | |
| 5,295,164 A | 3/1994 | Yamamura | |
| 5,410,263 A | 4/1995 | Waizman | |

(Continued)

FOREIGN PATENT DOCUMENTS

EP    1 276 240 A2    1/2003

OTHER PUBLICATIONS

DDR SDRAM Functionality and Controller Read Data Capture; http://download.micron.com/pdf/pubs/designline/dl399.pdf; Mar. 15, 2004, 24 pp.

(Continued)

*Primary Examiner* — Kim Huynh
*Assistant Examiner* — Michael J Brown
(74) *Attorney, Agent, or Firm* — Dorsey & Whitney LLP

(57) ABSTRACT

A system and method are disclosed to generate and terminate clock shift modes during initialization of a synchronous circuit (e.g., a delay-locked loop or DLL). Upon initialization, the DLL is entered into a ForceSL (Force Shift Left) mode and an On1x mode (i.e., left shifting on each clock cycle). The feedback clock that tracks the phase of the reference clock (which, in turn, is derived from the system clock) is initially delayed in a coarse phase detector prior to applying it to the coarse phase detection window. Two delayed versions of the feedback clock are sampled by the reference clock to generate a pair of phase information signals, which are then used to establish an advanced phase equal (APHEQ) signal. The APHEQ signal advances onset of the PHEQ (phase equalization) phase and is used to terminate the ForceSL and On1x modes, thereby preventing wrong ForceSL exit due to clock jitter or feedback path overshooting during On1x exit. The avoidance of wrong ForceSL exit and On1x overshooting problems further results in faster DLL locking time.

29 Claims, 10 Drawing Sheets

U.S. PATENT DOCUMENTS

| | | | |
|---|---|---|---|
| 5,537,068 A | 7/1996 | Konno |
| 5,537,069 A | 7/1996 | Volk |
| 5,717,652 A | 2/1998 | Ooishi |
| 5,724,007 A | 3/1998 | Mar |
| 5,790,612 A | 8/1998 | Chengson et al. |
| 5,815,016 A | 9/1998 | Erickson |
| 5,889,336 A | 3/1999 | Tateishi |
| 5,935,257 A | 8/1999 | Nishimura |
| 5,936,912 A | 8/1999 | Kawabata et al. |
| 6,049,239 A | 4/2000 | Eto et al. |
| 6,069,506 A | 5/2000 | Miller et al. |
| 6,078,514 A | 6/2000 | Takemae et al. |
| 6,087,868 A * | 7/2000 | Millar | 327/156 |
| 6,088,255 A | 7/2000 | Matsuzaki et al. |
| 6,101,197 A | 8/2000 | Keeth et al. |
| 6,140,854 A | 10/2000 | Coddington et al. |
| 6,150,859 A | 11/2000 | Park |
| 6,172,537 B1 | 1/2001 | Kanou et al. |
| 6,173,432 B1 | 1/2001 | Harrison |
| 6,212,126 B1 | 4/2001 | Sakamoto |
| 6,285,172 B1 | 9/2001 | Torbey |
| 6,316,976 B1 | 11/2001 | Miller et al. |
| 6,327,318 B1 | 12/2001 | Bhullar et al. |
| 6,337,590 B1 | 1/2002 | Millar |
| 6,373,913 B1 | 4/2002 | Lee |
| 6,404,248 B1 | 6/2002 | Yoneda | 327/158 |
| 6,448,820 B1 | 9/2002 | Wang et al. |
| 6,483,359 B2 | 11/2002 | Lee |
| 6,504,408 B1 | 1/2003 | von Kaenel |
| 6,556,489 B2 | 4/2003 | Gomm et al. |
| 6,556,643 B2 | 4/2003 | Merritt |
| 6,628,154 B2 | 9/2003 | Fiscus |
| 6,636,093 B1 | 10/2003 | Stubbs et al. |
| 6,639,958 B1 | 10/2003 | Hohler et al. |
| 6,664,830 B2 | 12/2003 | Miller |
| 6,680,874 B1 | 1/2004 | Harrison |
| 6,724,228 B2 | 4/2004 | Kashiwazaki |
| 6,727,739 B2 | 4/2004 | Stubbs et al. |
| 6,728,163 B2 | 4/2004 | Gomm et al. |
| 6,759,911 B2 | 7/2004 | Gomm et al. |
| 6,790,612 B2 | 9/2004 | Potts et al. |
| 6,798,259 B2 | 9/2004 | Lin |
| 6,801,094 B2 | 10/2004 | Aoki et al. | 331/25 |
| 6,803,826 B2 | 10/2004 | Gomm et al. |
| 6,812,760 B1 | 11/2004 | Kim et al. |
| 6,836,166 B2 | 12/2004 | Lin et al. |
| 6,895,522 B2 | 5/2005 | Johnson et al. |
| 6,919,745 B2 | 7/2005 | Lee et al. |
| 6,937,076 B2 | 8/2005 | Gomm |
| 7,034,589 B2 | 4/2006 | Chao |
| 7,078,950 B2 | 7/2006 | Johnson |
| 7,088,156 B2 | 8/2006 | Kim |
| 7,116,143 B2 | 10/2006 | Deivasigamani et al. |
| 7,421,606 B2 * | 9/2008 | Kim | 713/401 |
| 2002/0000854 A1 | 1/2002 | Hashimoto |
| 2002/0000855 A1 | 1/2002 | Lee |
| 2002/0036527 A1 | 3/2002 | Yoneda |
| 2002/0043996 A1 * | 4/2002 | Iwamoto | 327/158 |
| 2002/0089361 A1 | 7/2002 | Stubbs et al. |
| 2002/0130691 A1 | 9/2002 | Silvestri |
| 2003/0080791 A1 | 5/2003 | Fiscus |
| 2004/0046597 A1 | 3/2004 | Alon et al. |
| 2004/0140836 A1 | 7/2004 | Miller |
| 2004/0183577 A1 | 9/2004 | Kim |
| 2004/0213051 A1 | 10/2004 | Lin et al. |
| 2006/0045227 A1 | 3/2006 | Guan |

OTHER PUBLICATIONS

International Search Report and Written Opinion in International Application No. PCT/US2005/015717; search completed Aug. 12, 2005.

First Official Letter from the Taiwan Intellectual Property Office, Jul. 8, 2010 in Application No. 094114223.

* cited by examiner

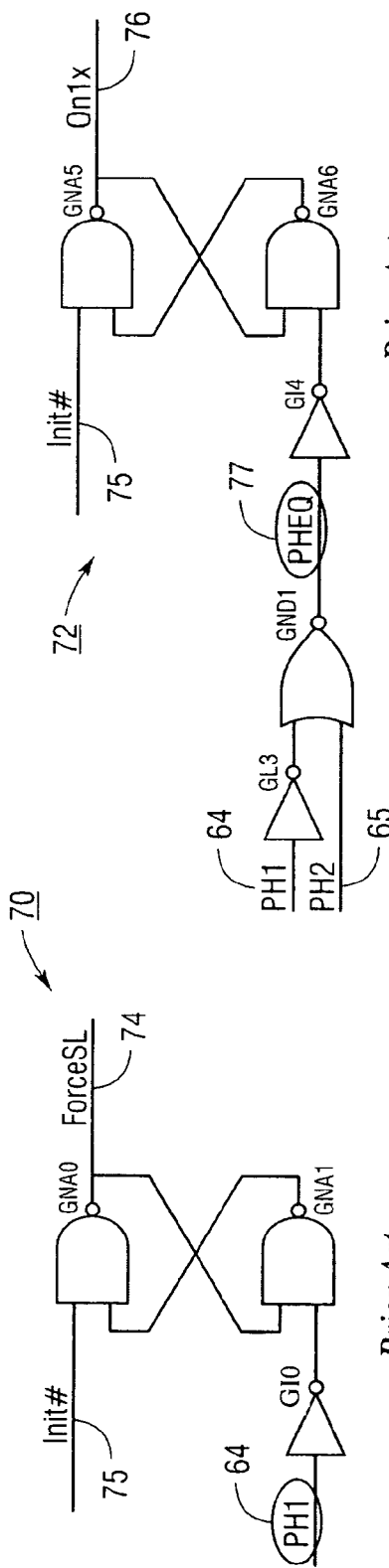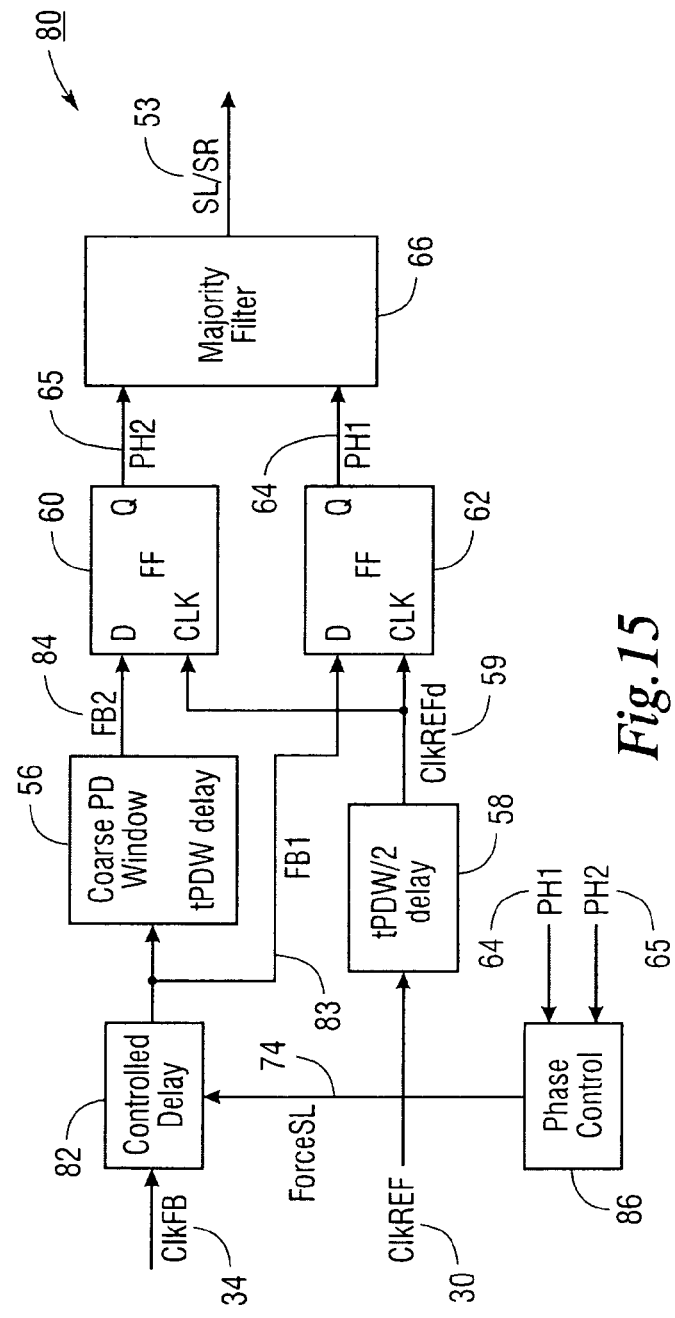

DLL PHASE DETECTION USING ADVANCED PHASE EQUALIZATION

REFERENCE TO RELATED APPLICATION

This application is a continuation of, and claims priority from, U.S. patent application Ser. No. 10/848,261 filed May 18, 2004, now U.S. Pat. No. 7,421,606, and titled DLL Phase Detection Using Advanced Phase Equalization, the entirety of which is hereby incorporated by reference for all purposes. The disclosure in the present application is related to the disclosure provided in the commonly assigned U.S. patent application Ser. No. 09/652,364, titled "A Phase Detector for All-Digital Phase Locked and Delay Locked Loops," filed on Aug. 31, 2000, now U.S. Pat. No. 6,779,126.

BACKGROUND

1. Field of the Disclosure

The present disclosure generally relates to synchronous circuits and, more particularly, to a system and method to generate and terminate clock shift modes during initialization of a synchronous circuit.

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the flow of commands, data, addresses, etc., into, through and out of the devices.

In SDRAMs or other semiconductor memory devices, it is desirable to have the data output from the memory synchronized with the system clock that also serves the microprocessor. Delay-locked loops (DLLs) are synchronous circuits used in SDRAMs to synchronize an external clock (e.g., the system clock serving a microprocessor) and an internal clock (e.g., the clock used internally within the SDRAM to perform data read/write operations on various memory cells) with each other. Typically, a DLL is a feedback circuit that operates to feed back a phase difference-related signal to control a delay line, until the timing of one clock signal (e.g., the system clock) is advanced or delayed until its rising edge is coincident (or "locked") with the rising edge of a second clock signal (e.g., the memory internal clock).

FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 14 located outside of chip 12 for electrically connecting the chip 12 to other system devices. Some of those pins 14 may constitute memory address pins or address bus 17, data pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS) signal, a column address strobe (CAS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 20. However, these peripheral devices or circuits are not shown in FIG. 1 for the sake of clarity.

The memory chip 12 may include a plurality of memory cells 20 generally arranged in rows and columns to store data in rows and columns. Each memory cell 20 may store a bit of data. A row decode circuit 22 and a column decode circuit 24 may select the rows and columns in the memory cells 20 in response to decoding an address, provided on the address bus 17. Data to/from the memory cells 20 is then transferred over the data bus 18 via sense amplifiers and a data output path (not shown). A memory controller (not shown) may provide relevant control signals (not shown) on the control bus 19 to control data communication to and from the memory chip 12 via an I/O (input/output) unit 26. The I/O unit 26 may include a number of data output buffers to receive the data bits from the memory cells 20 and provide those data bits or data signals to the corresponding data lines in the data bus 18. The I/O unit 26 may further include a clock synchronization unit or delay locked loop (DLL) 28 to synchronize the external system clock (e.g., the clock used by the memory controller (not shown) to clock address, data and control signals between the memory chip 12 and the controller) with the internal clock used by the memory 12 to perform data write/read operations on the memory cells 20.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices connected thereto via the pins 14 on the chip 12. These pins, as mentioned before, may be connected to appropriate address, data and control lines to carry out data transfer (i.e., data transmission and reception) operations.

FIG. 2 depicts a simplified block diagram of the delay-locked loop (DLL) 28 shown in FIG. 1. The DLL 28 receives a reference clock (ClkREF) 30 as an input and generates an output clock or the ClkOut signal 32 at its output. A ClkOut signal 32 is, in turn, fed back as a feedback clock (ClkFB) 34 as discussed later. The reference clock 30 is interchangeably referred to herein as "ClkREF", "ClkREF signal", "Ref clock signal" or "Ref clock"; whereas the feedback clock 34 is interchangeably referred to herein as "ClkFB", "ClkFB signal", "FB clock signal" or "FB clock." The reference clock 30 is typically the external system clock serving the microprocessor or a delayed/buffered version of it. In the embodiment of FIG. 2, the system clock 36 is shown buffered through a clock buffer 37. The output of the clock buffer 37—i.e., the Ref clock 30—thus is a buffered version of the system clock 36. In a register controlled DLL, the Ref clock 30 is input into a bank of registers and delay lines 38 as shown in FIG. 2. The registers in the bank 38 control delay lines with phase difference information received from a phase detector 40, as discussed below. For the ease of discussion, the bank of registers and delay lines 38 in FIG. 2 is referred to as "the delay line block" hereinbelow.

The clock output of the delay line block 38—the ClkOut signal 32—is used to provide the internal clock (not shown) used by the SDRAM 12 to perform data read/write operations on memory cells 20 and to transfer the data out of the SDRAM to the data requesting device (e.g., a microprocessor (not shown)). Thus, as shown in FIG. 2, the ClkOut 32 is sent to a clock distribution network or clock tree circuit 42 whose output 43 may be coupled to SDRAM clock driver and data output stages (not shown) in the I/O unit 26 to clock the data retrieval and transfer operations. As can be seen from FIG. 2, the ClkOut signal 32 (and, hence, the FB clock 34) is generated using delay lines in the delay line block 38, which introduces a specific delay into the input Ref clock 30 to obtain the "lock" condition.

As noted before, the purpose of the DLL 28 is to align or lock the memory's 12 internal clock (not shown) to the system's external clock (e.g., the system clock 36). A phase detector (PD) 40 compares the relative timing of the edges of the system clock 36 and the memory's internal clock (not shown) by comparing the relative timing of their respective representative signals—the Ref clock 30 which relates to the system clock 36, and the FB clock signal 34 which relates to the memory's internal clock—so as to establish the lock condition. As shown in FIG. 2, an I/O delay model circuit 44 may be a part of the DLL 28 to function as a buffer or dummy delay circuit for the ClkOut signal 32 before the ClkOut signal 32 is fed into the phase detector 40 as the FB clock 34. It is noted that although the ClkOut signal 32 is shown as an input to the I/O delay model 44, in some practical applications, the ClkOut signal 32 may still be an input to the clock distribution network 42, but another clock signal (not shown) received from the clock distribution network 42 may be fed as an input to the I/O delay model 44 instead of the ClkOut signal 32. In any event, the output of the I/O model 44 (i.e., the FB clock 34) effectively represents the memory's internal clock, which may be provided through the clock driver and data output stages (not shown) in the I/O unit 26. The I/O delay model 44 replicates the intrinsic delay of the clock feedback path, which includes the delay "A" of the system clock input buffer 37 and delay "B" that includes the delay encountered by the ClkOut signal 32 in the output data path (not shown) in the memory 12 prior to the output of the memory's internal clock (not shown). Thus, the I/O model 44 may be a replica of the system clock receiver circuit (not shown) that includes the external clock buffer 37, and the clock and data output path (not shown) so as to match respective delays imparted by these stages to the system clock 36 and the ClkOut signal 32, thereby making the Ref clock 30 and the FB clock 34 resemble, respectively, the system clock 36 and the internal clock (not shown) of the memory as closely as possible. Thus, the I/O delay model 44 attempts to maintain the phase relationship between the Ref clock 30 and the FB clock 34 as close as possible to the phase relationship that exists between the system clock 36 and the memory's internal clock (not shown).

The Ref clock 30 and the FB clock 34 are fed as inputs into the phase detector 40 for phase comparison. The output of the PD 40—a shift left (SL)/shift right (SR) signal 45—controls the amount of delay imparted to the ClkREF 30 by the delay line block 38. The SL/SR signal 45 may determine whether the Ref clock 30 should be shifted left (SL) or shifted right (SR) through the appropriate delay units in the delay line block 38 so as to match the phases of the Ref clock 30 and the FB clock 34 to establish the lock condition. The SL/SR signal 45 may be supplied to the delay line block 38 via a delay control unit 46, which may control the timing of application of the SL/SR signal 45 by generating a delay adjustment signal 47, which, in effect, serves the same purpose as the SL/SR signal 45 but its application to the delay line block 38 is controlled by the delay control unit 46. The delay imparted to the Ref clock 30 by the delay line block 38 operates to adjust the time difference between the output clock (i.e., the FB clock 34) and the input Ref clock 30 until they are aligned. The phase detector 40 generates the shift left and shift right signals depending on the detected phase difference or timing difference between the Ref clock 30 and the FB clock 34, as is known in the art.

FIG. 3 illustrates a timing mismatch between ClkREF 30 and ClkFB 34 operated on by the phase detector 40 in FIG. 2. As is seen from FIG. 3, ClkFB 34 is generated after an intrinsic delay (i.e., the total of delays A and B in FIG. 2) of $t_{ID}$ seconds has elapsed since the receipt of the first rising edge of ClkREF 30 by the phase detector 40. The mismatch between the timing of ClkREF 30 and ClkFB 34 is corrected by the phase detector 40 by instructing the delay line block 38 with appropriate shift left (SL) or shift right (SR) indication 45 to provide a delay equal to $m*t_D$, where "m" is the number of delay elements or delay lines in the delay line block 38 (m=0, 1, 2, 3, . . . ) and "$t_D$" is the delay provided by a single delay element or delay line. For example, if the clock period ($t_{CK}$) of the Ref clock 30 is 12 ns and $t_{ID}$=10 ns, then the DLL 28 has to push out the rising edge of ClkFB 34 or left shift ClkREF 30 by 2 ns ($t_{CK}-t_{ID}$=2 ns) to establish a "lock" (i.e., the rising edges of the Ref clock 30 and the FB clock 34 are substantially "aligned" or "synchronized" or almost "in phase"). In this example, if $t_D$=200 ps, then m=10. As is known in the art, the clock periods of ClkREF 30 and ClkFB 34 remain equal, but there may be a phase difference or timing mismatch ("lag" or "lead") between the two clocks that is detected by the phase detector 40 and adjusted by the delay line block 38 using the SL/SR signal 45 from the phase detector 40.

FIG. 4 depicts through a block diagram the major circuit elements of the phase detector 40 in FIG. 2. The phase detector 40 may include two phase detection units: a coarse phase detector 50 and a fine phase detector 52. The outputs 53-54 of the coarse and fine phase detectors, respectively, are supplied to the delay control unit 46 as respective SL/SR signals. Thus, in the embodiment of FIG. 4, the SL/SR signal 45 of FIG. 2 may consist of two separate SL/SR signals, each from one of the corresponding coarse and fine phase detectors 50, 52. The coarse phase detector 50 may initially act on ClkREF 30 and ClkFB 34 to instruct the delay line block 38 to provide a coarse delay to ClkREF 30 to establish a coarse phase alignment between ClkREF 30 and ClkFB 34. Thereafter, the fine phase detector 52 may take over and perform "fine tuning" or fine phase alignment of these two clocks to establish a perfect lock condition. During operation of the coarse phase detector 50, the delay control unit 46 may ignore any output 54 from the fine phase detector 52 until the output 53 of the coarse phase detector 50 indicates a primary "lock" (albeit, a rudimentary or less than perfect lock) between ClkREF 30 and ClkFB 34. Then the delay control unit 46 receives the output 54 from the fine phase detector 52 to instruct the delay line block 38 to provide a fine delay to ClkREF 30 until a perfect or fine lock between ClkREF 30 and ClkFB 34 is achieved.

FIG. 5 shows an exemplary block diagram depicting various circuit elements constituting the coarse phase detector 50 depicted in FIG. 4. The coarse phase detector 50 includes a coarse phase detection (PD) window 56 that provides an initial delay of "$t_{PDW}$" to ClkFB 34 to generate a delayed feedback clock signal (ClkFB2d) 57 at its output. The amount of the delay $t_{PDW}$ may be fixed or predetermined. Another delay element 58 provides $t_{PDW}/2$ delay (i.e., half of the delay provided by the coarse PD window 56) to ClkREF 30 to generate a delayed reference clock signal (ClkREFd) 59 at its output. The ClkREFd signal 59 clocks the sampler circuits (here, in the form of a set of D flipflops) 60, 62 to sample the feedback clock (ClkFB) 34 and the delayed feedback clock (ClkFB2d) 57 as shown in FIG. 5. The outputs PH1 (64) and PH2 (65) of D flipflops 62 and 60, respectively, represent the value of their respective D inputs (ClkFB 34 or ClkFB2d 57) sampled at the rising edge of ClkREFd 59. The values of PH1 and PH2 at any given instant determine the phase of ClkFB 34 with respect to the phase of ClkREF 30 (i.e., whether ClkFB 34 is in phase, 180° out of phase, etc. with respect to ClkREF 30 as discussed below). The relation between the phases of PH1 64 and PH2 65 may determine, as discussed in more detail below, whether to shift the reference clock 30 to the left or to the right. A majority filter 66 may be provided to receive PH1 (64), PH2 (65), and a counting clock signal (not shown) as inputs, and to responsively generate an appropriate SL/SR signal as the output 53 of the coarse phase detector 50. Although the construction of the majority filter 66 is not shown here, it is known in the art that the majority filter 66 may include a binary up/down counter (clocked by a counting clock signal (not shown)), which is incremented or decremented by the values of PH1 and PH2 signals 64-65. The counting clock may be the same as the system clock 36 or the reference clock 30. However, it is noted that a certain number of counting of input clock pulses (i.e., clock pulses of the counting clock signal (not shown)) may be required by the counter in the majority filter 66 before an SL or SR signal can be output. For example, the majority filter 66 may always count up to four input clock cycles (c=4) before generating an SL or SR indication. Such counting may consume time and delay the shifting of the Ref clock 30 and, hence, may delay the establishment of the lock as discussed in detail later hereinbelow.

FIG. 6 illustrates a phase relationship between the PH1 (64) and PH2 (65) signals generated by the coarse phase detector 50 in FIG. 5. As is shown in FIG. 6, the relationship between the phases of PH1 and PH2 may be used to identify what is the phase of ClkFB 34 with respect to ClkREF 30. In FIG. 6, the term "DP" (difference in phase) denotes the relative phase of ClkFB 34 with reference to ClkREF 30. Thus, for example, when both PH1 and PH2 achieve "high" or logic "1" values after their respective rising edges, that may indicate that ClkFB 34 is more than 180° but less than 360° out of phase with respect to ClkREF 30 as shown in FIG. 6. When this phase relationship between ClkFB 34 and ClkREF 30 is in effect, a shift left (SL) signal may be generated by the coarse phase detector 50 (as illustrated in FIG. 7A). Similarly, shift right (SR) signal may be generated when appropriate phase relationship between PH1 and PH2 as depicted in FIG. 6 arises. The output 53 of the coarse phase detector 50 may indicate a phase equal condition (PHEQ) when a certain phase relationship between PH1 and PH2 exists as shown in FIG. 6. The PHEQ condition may signify that ClkFB 34 is either substantially in phase (~0° phase difference) or substantially 360° out of phase with respect to ClkREF 30. Other phase relationships between ClkFB 34 and ClkREF 30 and corresponding function symbols in FIG. 6 are self explanatory and, hence, are not further discussed here.

FIGS. 7A-7C show the timing relationships among various waveforms in the coarse phase detector 50 of FIG. 5 and also shows whether the reference clock should be shifted left or right to establish a lock. In FIG. 7A, the coarse phase detector 50 is in the shift left (SL) mode because ClkFB 34 has more than 180° (but less than 360°) phase distortion (180<DP<360) with respect to ClkREF 30, thereby generating high (or logic "1") values for both PH1 (64) and PH2 (65) signals. During the SL mode, the DLL 28 increases delay applied to ClkREF 30. FIG. 7B shows exemplary signal waveforms for PHEQ mode. As is shown in FIG. 7B (and also in FIG. 6), in the PHEQ mode, the value of PH1 is "high" or logic "1" whereas the value of PH2 is "low" or logic "0." These values are generated when the phase of ClkFB 34 is similar (~0° or ~360° phase difference) to the phase of ClkREF 30. When the coarse phase detector 50 enters the PHEQ mode, the delay control unit 46 may start receiving output 54 from the fine phase detector 52. Thus, during PHEQ mode, fine phase detector 52 is active and after several successive PHEQ modes, a stable lock between ClkREF 30 and ClkFB 34 is established. FIG. 7C, on the other hand, shows the shift right (SR) mode of the coarse phase detector 50 because the phase distortion between ClkFB 34 and ClkREF 30 is more than 0° but less than 180° (0<DP<180), thereby generating a "low" or logic "0" value for both PH1 and PH2 signals as shown. During the SR mode, the DLL 28 decreases delay applied to ClkREF 30. Although the waveforms for the 180° phase distortion case (represented by the function symbol "P180" in FIG. 6) are not shown in FIGS. 7A-7C, it is noted here that when the phase of ClkFB 34 is around 180° out of phase with ClkREF 30, the coarse phase detector 50 enters the SL mode as depicted in FIG. 6.

FIG. 8 depicts a simplified and exemplary illustration of registers and delay lines in the delay line block 38 and also shows how the reference clock 30 is shifted through the delay lines during initialization of the DLL 28. FIG. 8 illustrates sixty-one (61) register-controlled delay lines in the delay line block 38. It is noted that the number of registers and delay lines in FIG. 8 are for illustration only. To make the function of DLL 28 simple, it is assumed that register # 0 (R0) is on or active upon initialization of the DLL 28. This means that the reference clock 30 initially bypasses the delay lines in the block 38. In the example discussed hereinbefore with reference to FIG. 3, it was noted that if $t_{CK}$=12 ns, $t_{ID}$=10 ns, and $t_D$=200 μs, then the DLL 28 would need m=10, i.e., DLL 28 would add delays through ten delay lines. Thus, in this example, ten left shifts (SLs) would be applied to ClkREF 30 from the initial entry point (R0) and register # 10 (R10) will represent the lock point. It was noted before that a left shift adds a delay whereas a right shift reduces a delay.

It is observed that during initialization of DLL 28, the SR (shift right) mode is not allowed, even though the DLL 28 could be in the SR region (e.g., the timing relationship between various clock waveforms may be similar to that in FIG. 7C) because there is no register on the right side of register # 0 (R0) in FIG. 8.

FIG. 9 illustrates an exemplary set of waveforms for the reference clock 30 and the feedback clock 34 upon initialization of the DLL 28 in FIG. 1. The waveforms in FIG. 9 depict a situation where a forced left shift (ForceSL or Force Shift Left) of the reference clock 30 is performed, even though the DLL 28 may be in the shift right (SR) mode (indicated by the crossed out portion in FIG. 9). For example, for the waveforms in FIG. 9, if $t_{CK}$=8 ns, $t_{ID}$=10 ns and $t_D$=200 ps, then DLL 28 would need 6 ns of additional (forced left shift) delays to establish a lock upon initialization of the DLL 28 because, in FIG. 9, 6 ns=$2t_{CK}-t_{ID}$=m*$t_D$. With the foregoing values, the value of "m" (i.e., the number of delay lines or delay elements) needed to establish a lock is m=30. Such a relatively high value of "m" may extend the time needed to establish a lock, especially when the majority filter 66 is used during DLL initialization as is discussed below with the example in FIG. 10. It is noted that the ForceSL mode is exited once the PH1 signal goes "high" or assumes a logic "1" value.

FIG. 10 shows another exemplary set of waveforms for the reference clock 30 and the feedback clock 34 upon initialization of the DLL 28 in FIG. 1. For the timing relationship illustrated in FIG. 10, the DLL 28 would be in the shift right (SR) mode upon initialization. However, as discussed with reference to FIG. 9, the DLL 28 would be forced to enter the shift left mode (ForceSL mode) during initialization. For the waveforms in FIG. 10, if $t_{CK}$=9.8 ns, $t_{ID}$=10 ns, and $t_D$=200 ps, then the DLL 28 has to shift left by 9.6 ns (m*$t_D$) using the ForceSL mode because 9.6 ns=2*$t_{CK}$−$t_{ID}$=m*$t_D$. With the foregoing values, the value of "m" (i.e., the number of delay lines or delay elements) needed to establish a lock is m=48. Therefore, if DLL 28 uses the majority filter 66 (with counting interval c=4, as mentioned before by way of an example with reference to FIG. 5) to establish lock during initialization, then 192 clock cycles may be needed to establish the lock point because c*m=4*48=192 $t_{CK}$. Hence, the use of majority filter 66 during initialization may significantly slow down the lock point establishment. This example illustrates the need to reduce the time needed to establish a lock.

To reduce the lock time upon initialization of the DLL 28, the "On1x" mode may be enabled during initialization. Typically, the On1x mode is only enabled during the initialization. Further, during the On1x mode, the DLL 28 enables the shift left (SL) command on every clock cycle (of the reference clock 30), and the majority filter 66 remains disabled during the On1x mode. Thus, during initialization, the DLL 28 may not only enter into the ForceSL mode, but may also enter into the On1x mode to perform left shifting on every clock cycle to expedite lock point establishment. The On1x mode is typically exited when the DLL 28 enters the PHEQ mode. However, it is observed that the On1x mode is generally good for slow frequency clocks only (with large $t_{CK}$), i.e., the ratio ($t_{CK}/t_{ID}$)>0.5. A high frequency reference clock 30 (small $t_{CK}$) may cause overshooting between the ClkREF 30 and ClkFB 34 after the On1x mode is exited by the PHEQ signal (which is generated when the DLL 28 enters the PHEQ mode as shown in FIG. 12).

FIG. 11 depicts an exemplary set of waveforms for a high frequency reference clock 30 and the corresponding feedback clock 34 upon initialization of the DLL 28 in FIG. 1. In the timing diagram of FIG. 11, $t_{CK}$=3 ns, $t_{ID}$=10 ns, and $t_D$=200 ps. Therefore, m*$t_D$=4*$t_{CK}$−$t_{ID}$=2 ns. Thus, m=10. However, as discussed below with reference to the expanded waveforms in FIG. 12, the overshooting between ClkREF 30 and ClkFB 34 occurs because On1x mode does not exit when m=10 is reached (i.e., when ten cycles of consecutive left shifts are performed), but exits when the DLL 28 enters the PHEQ mode. The overshooting results in this case because of small $t_{CK}$ (of ClkREF 30) and long feedback time ($t_{FB}$) as discussed with reference to FIG. 12.

FIG. 12 shows an exemplary set of waveforms to illustrate the overshooting problem encountered upon the exit of the On1x mode at high clock frequencies. It is noted here that because of a large number of waveforms in FIG. 12, no reference numerals are provided in FIG. 12 for ease of discussion and illustration. It is seen from FIG. 12 that the DLL 28 enters the ForceSL and On1x modes upon initialization. Thus, the left shifting of ClkREF 30 starts immediately after the first clock cycle of ClkFB 34 is received as indicated by the set of SL clocks at the top in FIG. 12. The On1x mode shifts ClkREF 30 left on each clock cycle of ClkRef 30 as indicated by the counting of the SL clocks in FIG. 12. Further, during On1x mode, the majority filter 66 remains disabled as seen from the waveform of the "Majority Filter Enable" signal at the bottom of FIG. 12. The generation of phase relation signals PH1 and PH2 is also illustrated in FIG. 12. The PHEQ signal in FIG. 12 is generated when the relation between the PH1 and PH2 signals indicate the PHEQ mode (as illustrated in FIG. 6). The other remaining signals—i.e., the ClkFB2d and ClkREFd signals—are the same as those illustrated in FIG. 5.

In the timing diagram of FIG. 12, as in FIG. 11, $t_{CK}$=3 ns, $t_{ID}$=10 ns, and $t_D$=200 ps. Therefore, m*$t_D$=4*$t_{CK}$−$t_{ID}$=2 ns. Thus, m=10. Hence, it is seen from the ClkREF and ClkFB waveforms in FIG. 12 that these two clocks are aligned after ten (10) consecutive left shifts or delays. However, because of the intrinsic delay ($t_{ID}$), small $t_{CK}$ (high reference clock frequency), and a long feedback time or feedback delay ($t_{FB}$=$t_{ID}$+m*$t_D$=4*$t_{CK}$ in FIG. 12), the On1x mode adds four additional left shifts (as shown by clock numbered 1 through 14 in the SL signal in FIG. 12) by the time the On1x mode exits by the rising edge of the PHEQ signal. This results in the overshooting illustrated in FIG. 12, which not only disrupts the phase alignment between ClkREF and ClkFB, but also further slows the lock establishment time by adding extra delays to establish lock. Furthermore, after On1x mode exits, the majority filter 66 (which was disabled during the On1x mode) may be needed to establish the lock because ClkREF and ClkFB are still not aligned at the time of On1x mode exit. The use of the majority filter 66 may further add locking delays as discussed hereinbefore with reference to FIG. 10.

It was noted before that the ForceSL mode exits at the rising edge of PH1 signal (as shown in FIG. 12). However, as discussed in the preceding paragraph, if the On1x mode is continued after ForceSL mode ends (as shown in FIG. 12), the problem of overshooting on the feedback path may occur, especially when $t_{FB}$>1*$t_{CK}$ ($t_{FB}$=4$t_{CK}$ for the waveforms in FIG. 12), which is quite common in modern high speed system and reference clocks. Therefore, it may be desirable to disable the On1x mode prior to activation of the PHEQ signal so as to prevent the overshooting.

FIGS. 13A and 13B illustrate two exemplary circuits 70, 72, respectively, to generate and terminate ForceSL 74 and On1x 76 signals shown in FIG. 12. In the circuit 70 of FIG. 13A, the initialization pulse 75 (Init #) is active "low". During initialization of DLL 28, the Init # signal goes low (preferably in a pulse form) to generate the ForceSL signal 74 (shown in FIG. 12) to enter the force shift left mode. The On1x signal 76 (shown in FIG. 12) is also generated similarly in the circuit 72 of FIG. 13B. The ForceSL mode is exited (i.e., the ForceSL signal 74 in FIG. 13B goes low) using the circuit 70 of FIG. 13A when the PH1 signal 64 goes high (as illustrated in FIG. 12). Similarly, the On1x mode is exited (i.e., the On1x signal 76 in FIG. 13B goes low) when the PHEQ signal 77 in the circuit 72 of FIG. 13B goes high (as illustrated in FIG. 12). It is seen from FIGS. 13A-B (and also from FIGS. 6 and 12) that the PHEQ signal 77 is generated when PH1 is high (logic "1") and PH2 is low (logic "0").

FIG. 14 depicts a set of waveforms illustrating the wrong ForceSL exit problem due to clock jitter. As in FIG. 12, because of a large number of waveforms in FIG. 14, no reference numerals are provided in FIG. 14 for ease of discussion and illustration. It was shown and discussed with reference to FIGS. 13A-B (and also with reference to FIG. 12) that ForceSL mode is exited when PH1 signal goes high. However, at long $t_{CK}$ (slower clock frequencies) and short $t_{ID}$, the clock jitter may cause the ForceSL mode to exit prematurely as shown through the waveforms in FIG. 14. In the embodiment of FIG. 14, the On1x mode is also exited together with the ForceSL mode. However, as discussed before with reference to FIG. 12, when the On1x mode is exited after the ForceSL mode, the problem of overshooting in the feedback path may occur, especially at higher frequencies. In case of the waveforms in FIG. 14, the untimely or wrong ForceSL/On1x exit results in activation of the majority filter 66 (through the Majority Filter Enable signal) to establish the lock. The majority filter 66, as already discussed before, significantly delays lock establishment, especially during DLL initialization. It is observed here that the wrong ForceSL exit problem may be solved using an appropriate filter, but the On1x overshooting problem may still remain.

Therefore, it is desirable to disable the On1x mode prior to activation of the PHEQ signal so as to prevent the overshooting on the feedback path, especially when the On1x mode is exited after the ForceSL mode. In the event that the ForceSL and the On1x mode are exited together, it may still be desirable to prevent wrong ForceSL exit due to clock jitter or noise without using additional filter circuits. It is also desirable to avoid wrong ForceSL exit and On1x overshooting problems so as to achieve faster DLL locking time.

SUMMARY

The present disclosure contemplates a method of operating a synchronous circuit. The method comprises: applying a reference clock as an input to a delay line as part of the synchronous circuit; generating a feedback clock at an output of the delay line using the reference clock; obtaining a first delayed feedback clock and a second delayed feedback clock from the feedback clock; and generating a shift signal to shift the reference clock through the delay line based on a relationship among the phases of the reference clock, the first delayed feedback clock, and the second delayed feedback clock.

In one embodiment, the present disclosure contemplates a method that comprises: obtaining a reference clock; generating a feedback clock from the reference clock, wherein frequencies of the feedback clock and the reference clock are identical; obtaining a first delayed feedback clock and a second delayed feedback clock from the feedback clock; and shifting the reference clock left or right based on a relationship among the phases of the reference clock, the first delayed feedback clock, and the second delayed feedback clock.

In a further embodiment, the present disclosure contemplates a method that comprises: obtaining a reference clock; entering a first shift left mode to shift the reference clock leftward; generating a feedback clock from the reference clock; monitoring a phase relationship between the phases of the reference clock and the feedback clock; and exiting the first shift left mode when the phase relationship indicates that the feedback clock is more than 180° but less than 360° out of phase with the reference clock.

In a still further embodiment, the present disclosure contemplates a synchronous circuit (e.g., a delay locked loop) constructed to include a coarse phase detector according to the teachings of the present disclosure. In an alternative embodiment, the present disclosure contemplates a system that comprises a processor, a bus, and a memory device coupled to the processor via the bus and including the synchronous circuit.

The system and method of the present disclosure generate and terminate clock shift modes during initialization of a synchronous circuit (e.g., a delay-locked loop or DLL). Upon initialization, the DLL is entered into a ForceSL (Force Shift Left) mode and an On1x mode (i.e., left shifting on each clock cycle). The feedback clock that tracks the phase of the reference clock (which, in turn, is derived from the system clock) is initially delayed in a coarse phase detector prior to applying it to the coarse phase detection window. Two delayed versions of the feedback clock are sampled by the reference clock to generate a pair of phase information signals, which are then used to establish an advanced phase equal (APHEQ) signal. The APHEQ signal advances onset of the PHEQ (phase equalization) phase and is used to terminate the ForceSL and On1x modes, thereby preventing wrong ForceSL exit due to clock jitter or feedback path overshooting during On1x exit. The avoidance of wrong ForceSL exit and On1x overshooting problems further results in faster DLL locking time.

BRIEF DESCRIPTION OF THE DRAWINGS

For the present disclosure to be easily understood and readily practiced, the present disclosure will now be described for purposes of illustration and not limitation, in connection with the following figures, wherein:

FIGS. 13A and 13B illustrate two exemplary circuits to generate and terminate ForceSL and On1x signals, respectively, shown in FIG. 12;

FIG. 15 shows a coarse phase detector according to one embodiment of the present disclosure;

DETAILED DESCRIPTION

Figure 1:
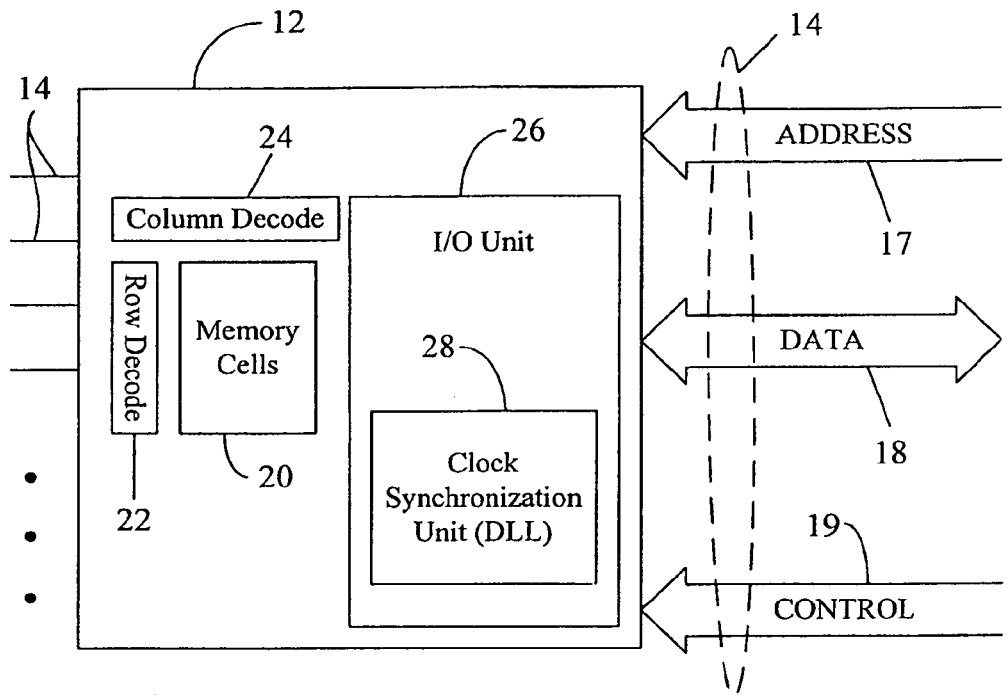
FIG. 1 is a simplified block diagram showing a memory chip or memory device.
Figure 2:
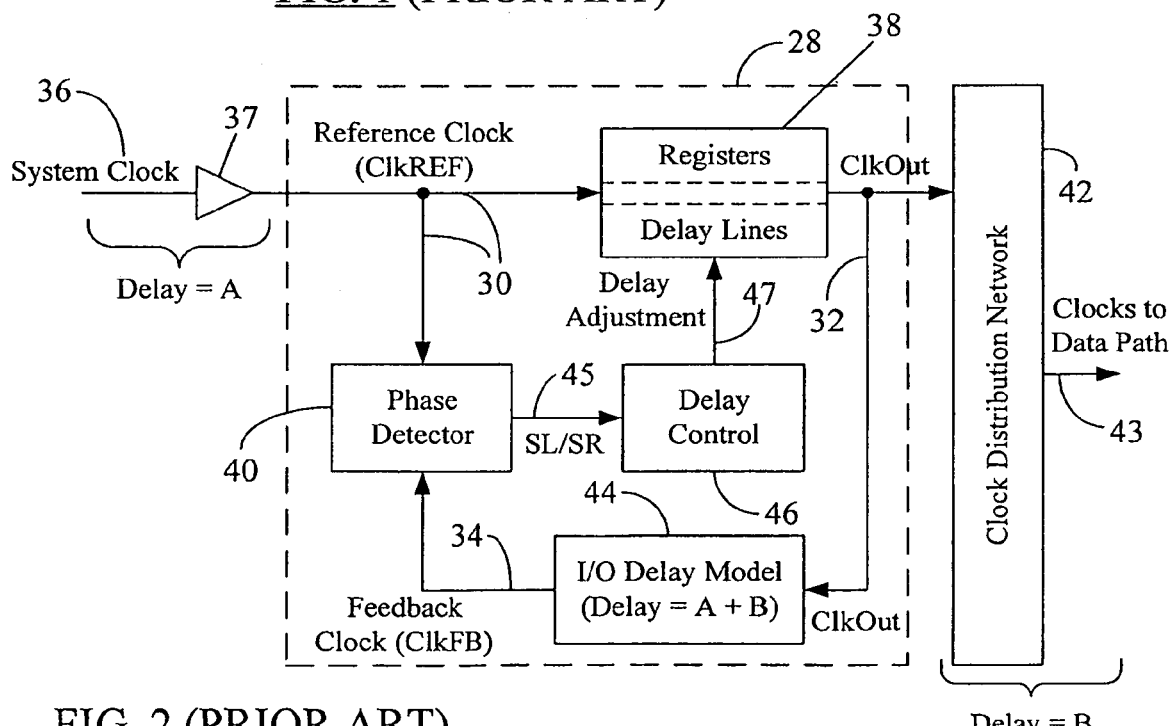
FIG. 2 depicts a simplified block diagram of the delay-locked loop shown in FIG. 1.
Figure 3:
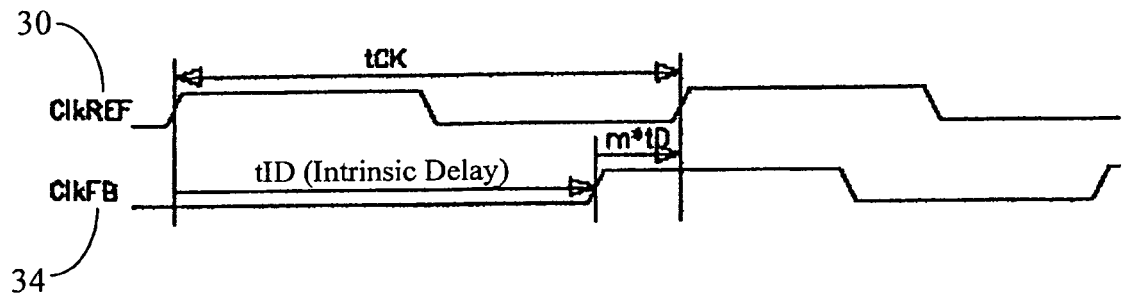
FIG. 3 illustrates a timing mismatch between ClkREF and ClkFB operated on by the phase detector in FIG. 2.

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state memories or memory-based systems. It is noted at the outset that the terms "connected", "connecting," "electrically connected," etc., are used interchangeably herein to generally refer to the condition of being electrically connected. It is further noted that various block diagrams, circuit diagrams and timing waveforms shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

FIG. 15 shows a coarse phase detector 80 according to one embodiment of the present disclosure. The phase detector 80 is similar to the prior art phase detector 50 in FIG. 5, except for the addition of two circuit elements: a controlled delay unit 82, and a phase control unit 86. The presence of units 82 and 86 in the phase detector 80 results in a solution of the problems of wrong ForceSL exit and On1x overshooting discussed before under the "Background" section. It is noted here that the same reference numerals are used to refer to similar circuit elements in FIGS. 5 and 15 for the sake of clarity of discussion and ease of comparison between the embodiments in FIGS. 5 and 15. It is evident to one skilled in the art, however, that although the final output of both the phase detectors 50 and 80 is the SL/SR signal 53, the overall operation of the phase detector 80 (as depicted through a set of waveforms in FIG. 17) is different from that of the prior art phase detector 50 in FIG. 5.

In the coarse phase detector 80 of FIG. 15, a first delay is applied to the feedback clock 34 through the controlled delay unit 82, thereby generating a first delayed feedback clock (FB1) 83. The operation of the controlled delay unit 82 is discussed hereinbelow with reference to FIG. 16. The FB1 clock 83 is then applied to the coarse PD window 56 to generate a second delayed feedback clock (FB2) 84. The delayed reference clock 59 samples the FB1 clock 83 (through the D flipflop 62) and the FB2 clock 84 (through the D flipflop 60) to generate the PH1 (64) and PH2 (65) signals, respectively, in the manner discussed hereinbefore with reference to FIG. 5. The SL/SR signal output 53 is eventually generated from the PH1 and PH2 signals in the same manner as discussed before with reference to FIG. 5. The phase control unit 86 applies the ForceSL signal 74 to the controlled delay unit 82 to control the application of the delay to ClkFB 34. A circuit layout for the phase control unit 86 is provided in FIG. 18 and discussed later hereinbelow. It is noted here, however, that although the same reference numeral "74" is used in FIG. 15 (and, also in FIGS. 16 and 18) as in FIG. 13A to refer to the ForceSL signal, it is evident that the embodiment in FIG. 13A and that in FIGS. 15-18 are different. The use of same reference numerals for identically-named signals is for convenience and ease of discussion only.

Figure 16:
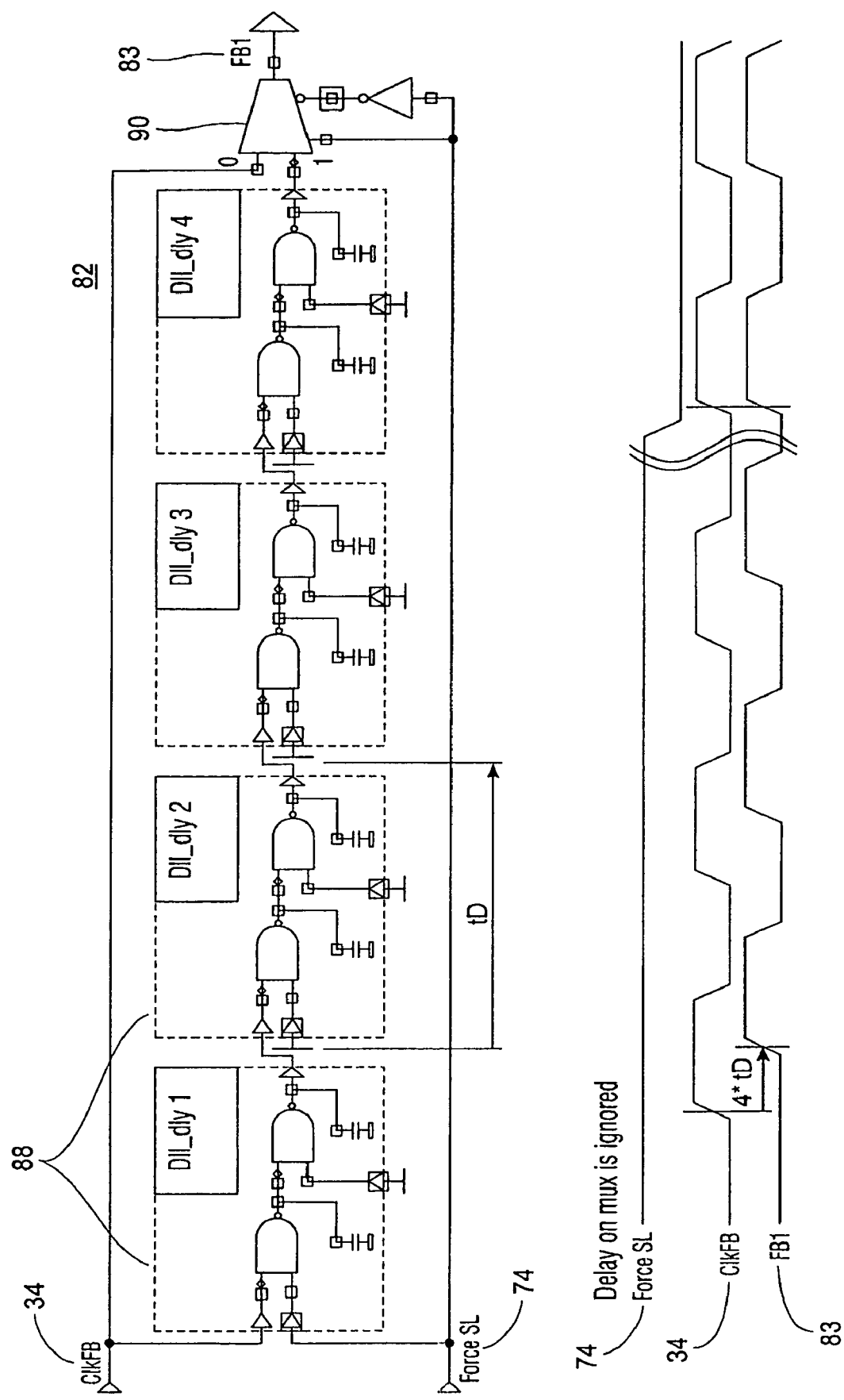
FIG. 16 illustrates an exemplary circuit layout and corresponding signal waveforms for the controlled delay unit shown in FIG. 15.

FIG. 16 illustrates an exemplary circuit layout 82 and corresponding signal waveforms for the controlled delay unit 82 shown in FIG. 15. The controlled delay unit 82 applies delay to the ClkFB 34 (thereby generating the first delayed feedback clock 83) based on the signal level of the ForceSL signal 74. The controlled delay unit 82 may include a number of delay elements 88 whose output is multiplexed with ClkFB signal 34 using a multiplexer 90 whose output (the FB1 clock 83) is then controlled by the ForceSL signal 74 as shown in FIG. 16. Each delay element 88 provides a unit delay ($t_D$) to ClkFB 34 as shown. Each delay element 88 may consist of a combination of a delay line and a pair of AND gates as shown in FIG. 16. The delay element 88 may be similar to a delay line in the delay line block 38. The construction and operation of a unit delay element is well known in the art and, hence, no additional discussion thereof is provided herein. It is noted, however, that the number of delay elements 88 in an implementation of the coarse phase detector 80 may either be fixed (or predetermined) or variable. In one embodiment, the number of delay elements 88 for a particular coarse phase detector 80 is determined based on the latency of RAS (Row Address Strobe) and CAS (Column Address Strobe) signals from a memory controller (not shown) or on the ratio of the feedback delay ($t_{FB}$) to the reference clock cycle ($t_{CK}$)($t_{FB}/t_{CK}$). For example, in case of timing relation of high frequency clocks shown in FIG. 12, $t_{FB}=4*t_{CK}$. Therefore, a controlled delay unit (e.g., the unit 82 in FIG. 16) designed to handle the same clock frequencies as shown in FIG. 12 may have four (4) delay elements 88 as shown, for example, in FIG. 16.

FIG. 16 also illustrates the waveforms showing timing relationship between various signals in the controlled delay unit 82. As is seen in FIG. 16, the controlled delay unit 82 bypasses the four delay elements 88 once the ForceSL signal 74 goes inactive (or "low"). In that case, the FB1 clock 83 becomes the same as ClkFB 34 and is no longer a delayed version of ClkFB 34 as can be seen from the waveforms in FIG. 16. It is noted here that the delay provided by the multiplexer 90 is ignored in depicting the waveforms in FIG. 16.

The use of the controlled delay unit 82 to "mirror" the feedback delay ($t_{FB}$) by providing that delay to ClkFB 34 through the delay elements 88 in advance of the application of ClkFB 34 to the coarse phase detection window 56 (and also to the sampling circuit 62) results in generation of an Advanced Phase Equal (APHEQ) signal 92 that allows timely termination of the ForceSL and On1x modes without the problems of clock jitter and overshooting as discussed below with reference to FIGS. 17 and 18. That is, the APHEQ signal 92 is generated in advance of or ahead in time of the PHEQ signal 77 shown in FIGS. 12-13 to prevent clock overshooting.

Figure 6:
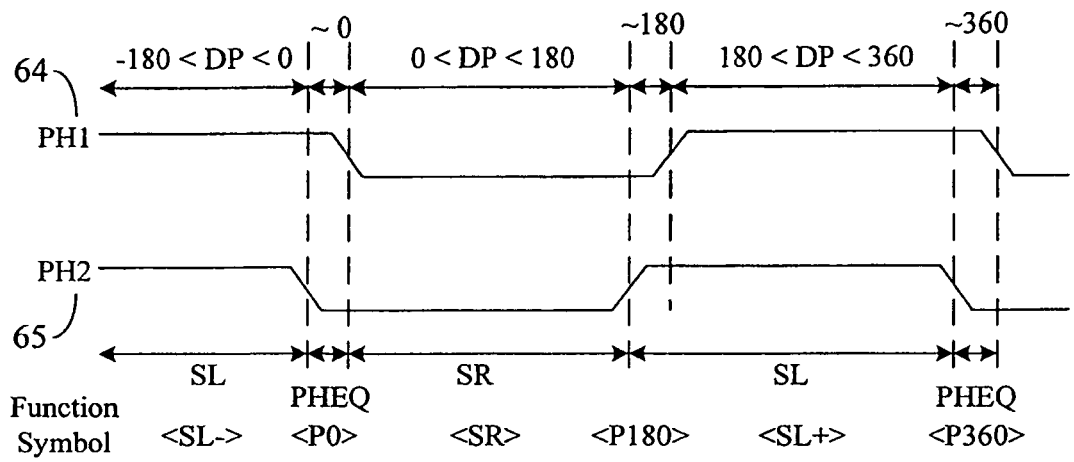
FIG. 6 illustrates a phase relationship between the PH1 and PH2 signals generated by the coarse phase detector in FIG. 5.
Figure 7A:
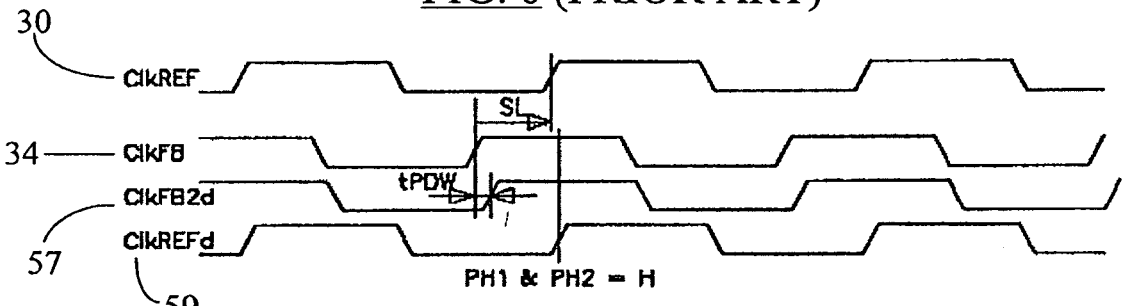
FIGS. 7A-7C show the timing relationships among various waveforms in the coarse phase detector of FIG. 5 and also shows whether the reference clock should be shifted left or right to establish a lock.
Figure 7B:
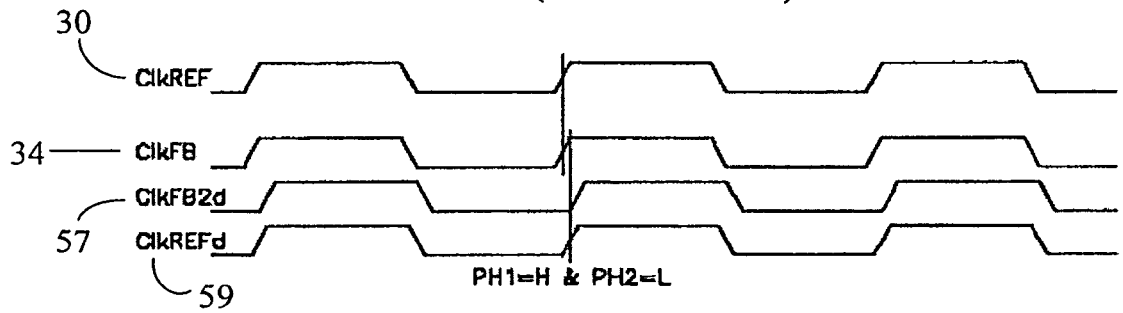
Figure 7C:
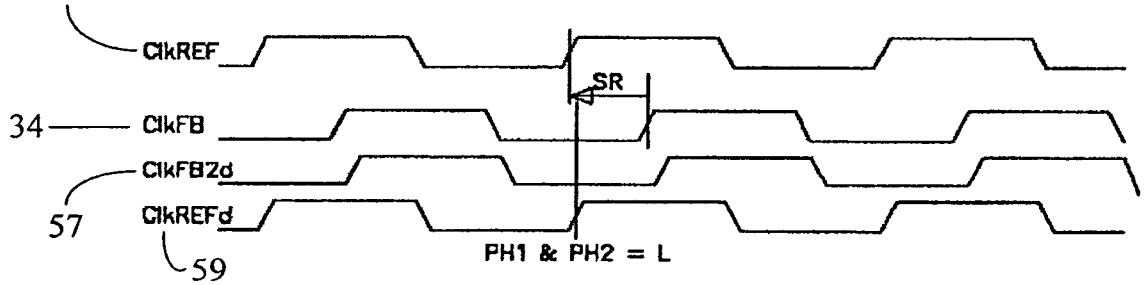
Figure 8:
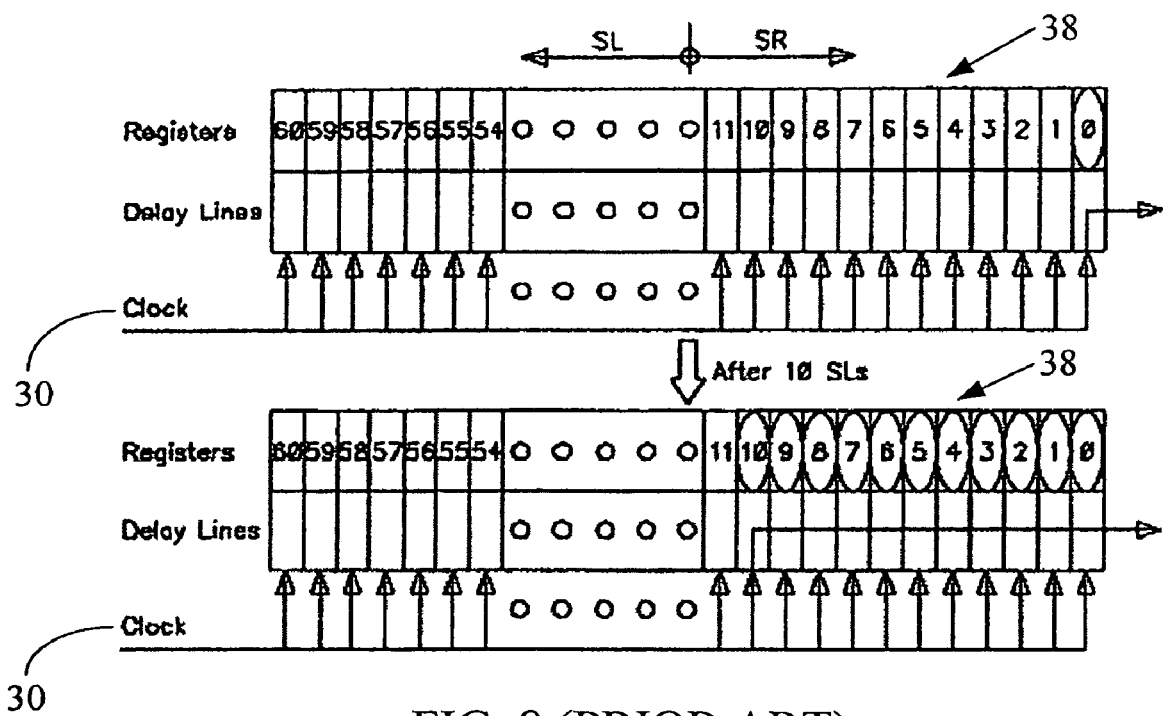
FIG. 8 depicts a simplified and exemplary illustration of registers and delay lines in the delay line block and also shows how the reference clock is shifted through the delay lines during initialization of the DLL.
Figure 9:
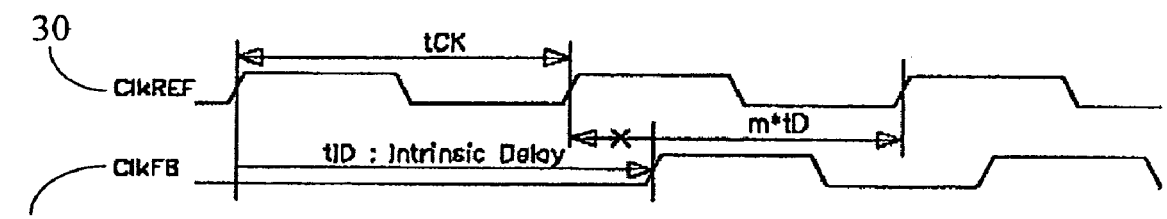
FIG. 9 illustrates an exemplary set of waveforms for the reference clock and the feedback clock upon initialization of the DLL in FIG. 1.
Figure 10:
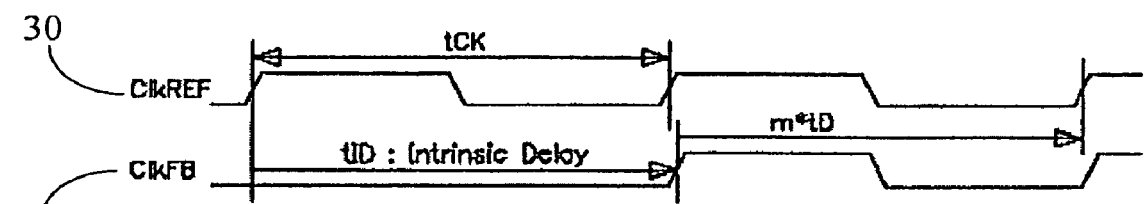
FIG. 10 shows another exemplary set of waveforms for the reference clock and the feedback clock upon initialization of the DLL in FIG. 1.
Figure 11:
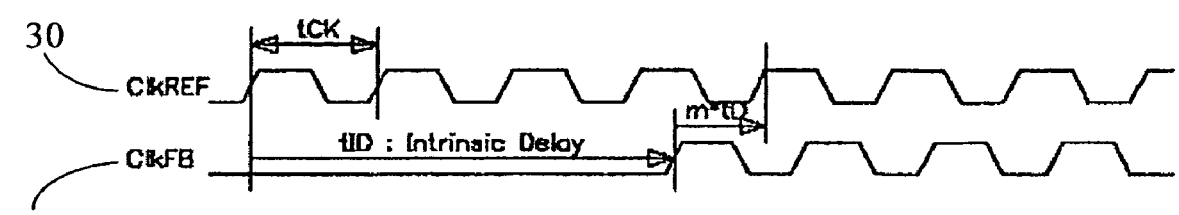
FIG. 11 depicts an exemplary set of waveforms for a high frequency reference clock and the corresponding feedback clock upon initialization of the DLL in FIG. 1.
Figure 12:
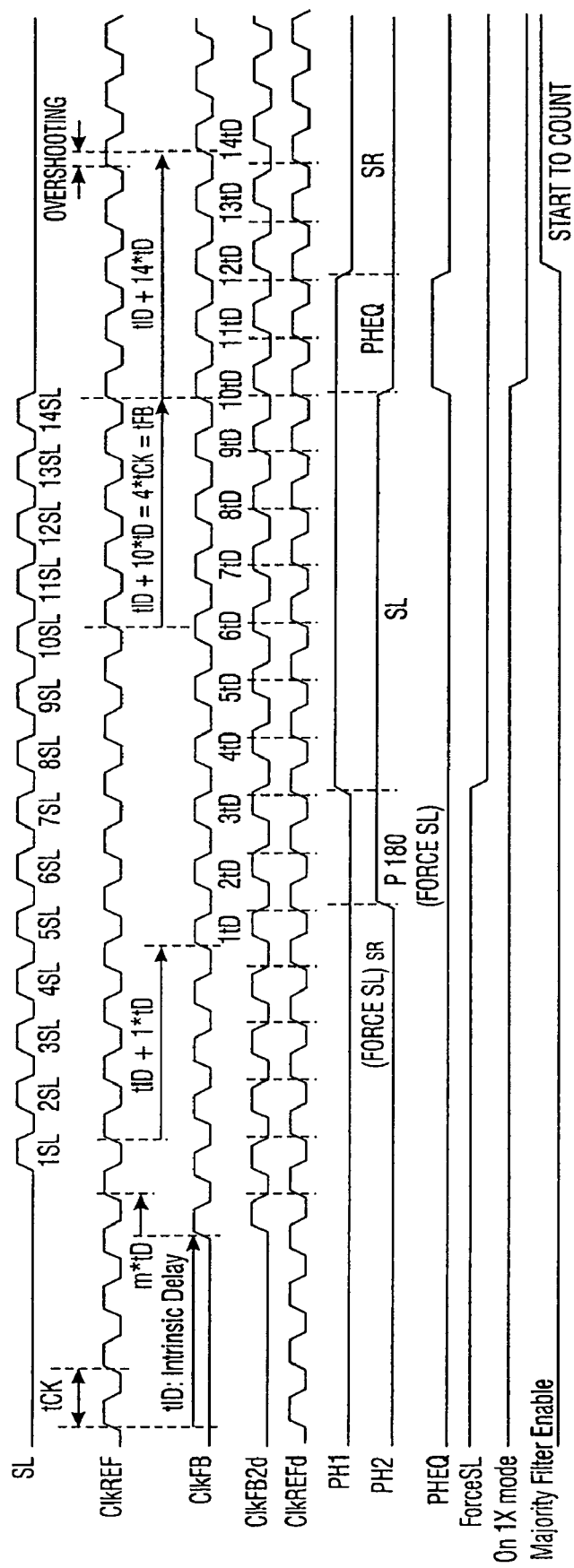
FIG. 12 shows an exemplary set of waveforms to illustrate the overshooting problem encountered upon the exit of the On1x mode at high clock frequencies.
Figure 17:
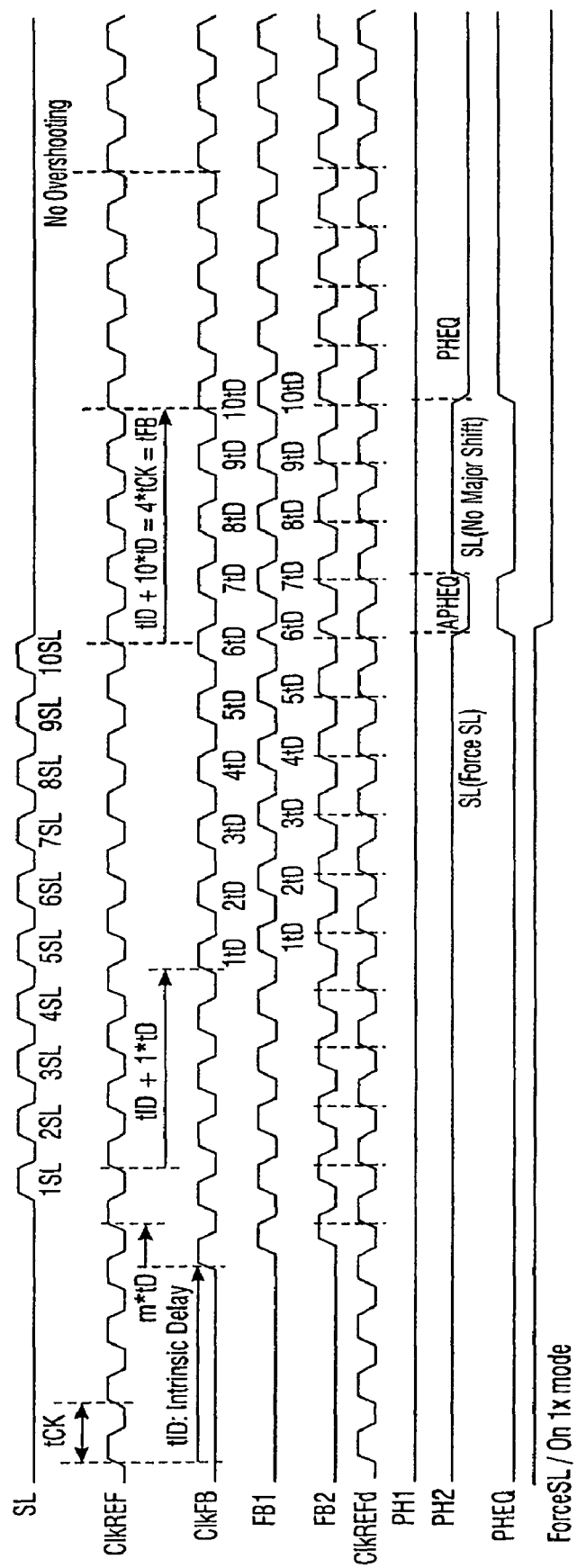
FIG. 17 depicts an exemplary set of waveforms illustrating how the overshooting problem illustrated in FIG. 12 is avoided by use of the coarse phase detector of FIG. 15.

FIG. 17 depicts an exemplary set of waveforms illustrating how the overshooting problem illustrated in FIG. 12 is avoided by use of the coarse phase detector 80 of FIG. 15. As noted before, at high system clock frequency, $t_{FB}$ (the feedback delay) may not be equal to $t_{CK}$. Therefore, the normal termination of On1x mode (as shown in FIG. 12) results in overshooting and it may not be desirable because, at high frequency, such overshooting may result in skipping of several lock points as discussed hereinbefore with reference to FIG. 12. The waveforms in FIG. 17 illustrate the same high frequency signals ($t_{FB}=4*t_{CK}$) as shown in FIG. 12. The values of various timing parameters (e.g., $t_{ID}$, $t_D$, etc.) are also the same in FIGS. 12 and 17. However, it is seen from FIG. 17 that the problem of overshooting has been eliminated. That is, no feedback path overshooting occurs in FIG. 17 even after the On1x mode is disabled. The generation of FB1 and FB2 clocks in the embodiment of FIG. 15 allows the coarse PD window 56 to "see" the phase information between ClkREF 30 and ClkFB 34 not delayed by $t_{FB}$ (as was the case in the embodiment of FIG. 12), but advanced by $t_{FB}$ (by use of the controlled delay unit 82 in FIG. 15). Thus, the arrangement of FIG. 15 results in generation of the APHEQ phase in advance of the generation of the "regular" PHEQ phase as shown in FIG. 17. In the embodiment of FIG. 17, the On1x mode and the ForceSL mode are exited by APHEQ signal 92 (FIG. 18), which is generated during the SL mode, i.e., when the phase difference between ClkFB 34 and ClkREF 30 is more than 180° but less than 360° as shown in FIG. 6. Thus, the coarse phase detector 80 of FIG. 15 generates a "dip" in the waveform of PH2 (as shown in FIG. 17) prior to the "regular" PHEQ phase represented by the low level of PH2 and high level of PH1 (as shown in FIG. 6). This "dip" represents the advanced phased equal phase (APHEQ phase), which is treated as the triggering event for termination of the ForceSL and On1x modes as shown in FIG. 17.

It is observed here that no separate AHEQ signal is shown in FIG. 17, but the APHEQ phase is represented by the appearance of the first "high" level on the PHEQ signal in FIG. 17. As is seen from FIG. 17, this first "high" level of PHEQ signal is followed by another "high" level representing the "regular" PHEQ phase discussed hereinbefore with reference to FIGS. 6 and 12. Thus, the circuit arrangement of FIG. 15 results in advancement of the PHEQ phase (as represented by the APHEQ phase in FIG. 17), which functions to timely terminate the ForceSL and On1x modes before extra shift left signals (SL clock at top in FIG. 17) are generated. A comparison of FIGS. 12 and 17 shows that the termination of On1x mode by the APHEQ phase stops the SL clock at m=10, i.e., when the $10^{th}$ shift left signal is generated, as opposed to when four additional SL signals are generated as in FIG. 12 (because of the termination of On1x mode by a late PHEQ signal in FIG. 12). Thus, although the On1x modes in FIGS. 12 and 17 are both terminated by the PHEQ signal, the advancement of generation of the PHEQ signal (through the APHEQ phase) in FIG. 17 results in timely termination of On1x mode in FIG. 17, and thus prevention of the clock overshooting problem.

Figure 4:
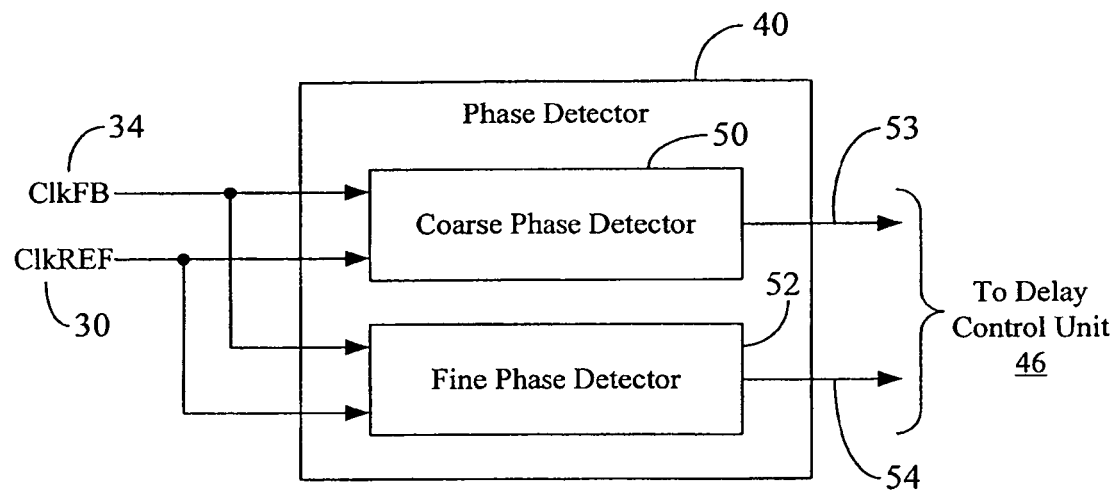
FIG. 4 depicts through a block diagram the major circuit elements of the phase detector in FIG. 2.

It was noted before with reference to FIG. 12 that even if the On1x and the ForceSL modes are terminated together, there is still some time delay involved in establishing the lock because of the activation and lock establishment through the majority filter 66. On the other hand, although the majority filter 66 gets activated (after appropriate delay) once the On1x mode is disabled in the embodiment of FIG. 17, that activation does not add any additional delays to lock establishment because, as seen from FIG. 17, the ClkFB 34 and ClkREF 30 clocks already are coarse-aligned after $t_{FB}$ time has elapsed because of the disablement of the On1x mode. In the absence of overshooting, there may be no additional need to establish coarse alignment using the majority filter 66. Therefore, in that event, the delay control unit 46 may start receiving the output from the fine phase detector 52 (FIG. 4) and, hence, any delaying effect of majority filter 66 may be ignored by the delay control unit 46.

It is observed with reference to FIG. 17 that the waveforms shown therein are exemplary in nature. Thus, for example, the values of PH1 and PH2 signals shown in FIG. 17 may differ from one reference clock 30 to another, and may not even be identical from one set of DLL initialization waveforms to another because slightly different timing relationships may be present between FB1 (83), FB2 (84) and ClkREFd (59) clocks upon each DLL initialization. However, it is noted that generation of APHEQ phase (and, hence, termination of ForceSL and On1x modes) relies on specific values of both PH1 and PH2 signals and, hence, the timing of generation of APHEQ phase may be affected by PH1 and PH2 signals only. Further, in the embodiment of FIG. 17, both PH1 and PH2 signals are used to terminate the ForceSL mode (via activation of the APHEQ phase), instead of just the PH1 signal terminating the ForceSL mode as in the embodiment of FIG. 12. Thus, the On1x mode and the ForceSL mode in FIG. 17 are terminated as soon as the first occurrence of the specific set of values for PH1 and PH2 (resulting in generation of the APHEQ phase), i.e., the value of PH1 is "high" or logic "1" and the value of PH2 is "low" or logic "0". Of course the same set of values for PH1 and PH2 results in the later generation of the PHEQ phase, the termination of the On1x mode and the ForceSL mode in the embodiment of FIG. 17 is not made dependent on this later generated PHEQ phase (which was the case in the embodiment of FIG. 12).

Figure 14:
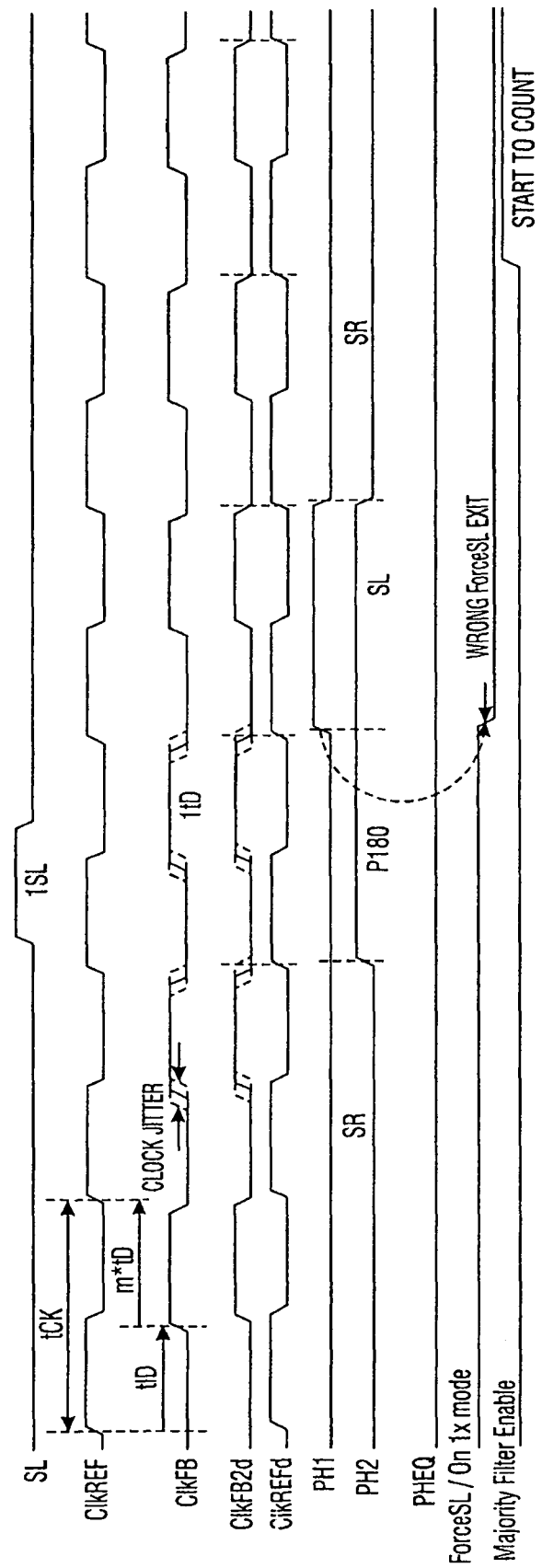
FIG. 14 depicts a set of waveforms illustrating the wrong ForceSL exit problem due to clock jitter.

It is noted that although ForceSL and On1x modes are disabled together in the embodiment of FIG. 17, the On1x mode may be deactivated after ForceSL mode as discussed before (e.g., upon onset of the PHEQ phase succeeding the APHEQ phase shown in FIG. 17). In any event, i.e., whether On1x and ForceSL modes are disabled together or at different times, the coarse phase detector 80 of FIG. 15 would prevent wrong ForceSL exit due to clock jitter or feedback clock overshooting upon On1x mode exit. The problem of wrong ForceSL exit due to clock jitter is avoided because ForceSL mode is exited by APHEQ phase (or the APHEQ signal 92 in FIG. 18), which may occur far from the P180 boundary (FIG. 6) between SR and SL modes. For example, in the embodiment of FIG. 14, the wrong ForceSL exit occurs at the P180 boundary (denoted in the waveform for the PH2 signal in FIG. 14), whereas, in FIG. 17, the ForceSL mode is exited during the SL mode (because the APHEQ signal terminating the ForceSL mode is generated during the SL mode) and far from the P180 boundary. Further, in the prior art, the ForceSL mode was terminated using the value of the PH1 signal only as discussed hereinbefore with reference to, for example, FIG. 12 and also shown in FIG. 14. On the other hand, in the embodiment of FIG. 17, the ForceSL mode is disabled using the values of PH1 and PH2 signals both, which further avoids wrong ForceSL exit due to clock jitter.

It is further noted that the phases of ClkREF 30 and ClkFB 34 may not be aligned at the time of onset of the APHEQ phase as shown, for example, in FIG. 17. Thus, the generation of the APHEQ signal 92 (FIG. 18) may not mean that ClkREF 30 and ClkFB 34 are in fact aligned. However, the occurrence of the APHEQ phase signals the termination of the ForceSL mode (and also the On1x mode in FIG. 17) so as to allow proper time delay to achieve coarse locking of ClkREF and ClkFB without being affected by the problems of clock jitter or overshooting. In one embodiment, the On1x mode may be exited not by the onset of the APHEQ phase, but by the succeeding PHEQ phase in the manner discussed hereinbefore with reference to FIG. 12. In such an event, the problem of feedback clock overshooting may not happen because of the manner in which the PH1 and PH2 signals are generated by the coarse phase detector 80 using the phase relationship among two delayed versions of the feedback clock 34 as discussed before.

Figure 18:
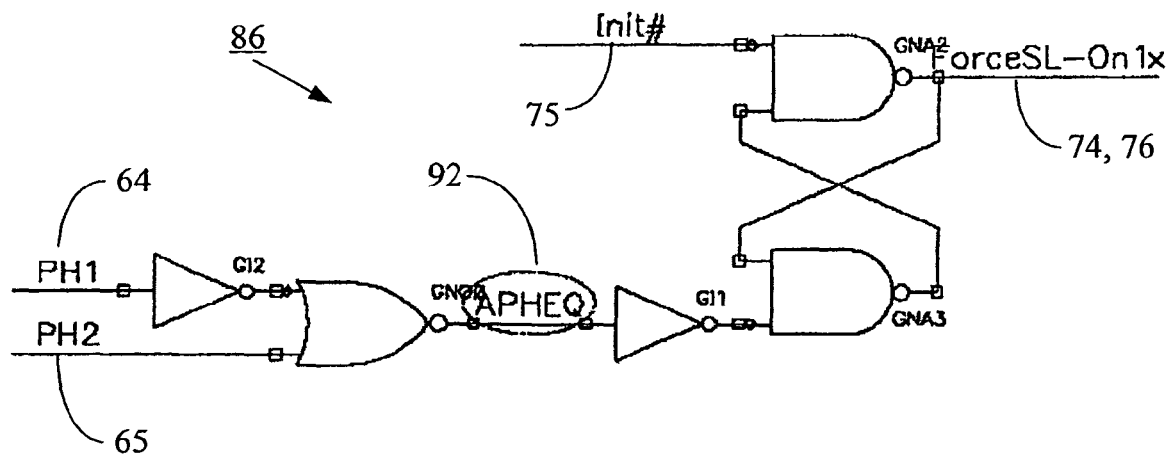
FIG. 18 shows an exemplary circuit for the phase control unit of FIG. 15.

FIG. 18 shows an exemplary circuit for the phase control unit 86 of FIG. 15. The circuit in FIG. 18 is substantially similar to that in FIG. 13B and, hence, no detailed explanation is provided for FIG. 18. It is observed from a comparison of FIGS. 13B and 18 that the APHEQ signal 92 in FIG. 18 is used in place of the PHEQ signal 77 in FIG. 13B to terminate both the ForceSL and On1x modes. The ForceSL signal 74 and the On1x signal 76 are generated together using the Init# signal in the same manner as discussed before with reference to FIGS. 13A-B. However, instead of the "regular" PHEQ signal 77 terminating the On1x mode, the APHEQ signal 92 (which is generated in advance of the "regular" PHEQ signal 77) is used in FIG. 18 to terminate both the ForceSL and the On1x modes. Thus, in FIG. 18, the APHEQ signal 92 is used in the same manner as the PHEQ signal 77 in FIG. 13B to achieve the desired terminations. It is again noted that although the term "APHEQ" is used to distinguish the phase equal signal PHEQ 77 from the APHEQ signal 92, in practice, both of these signals are part of the same PHEQ phase shown in FIG. 6 and as indicated by the PHEQ waveform in FIG. 17. Thus, the APHEQ phase is nothing but the first occurrence of the PHEQ phase during DLL initialization. The PHEQ phase may occur (as indicated by the PHEQ signal in FIG. 17 going "high" (or logic "1") again after APHEQ phase is over as shown in FIG. 17.

It is noted that the discussion given hereinbefore relates to the coarse phase detector 80 according to one embodiment of the present disclosure. The coarse phase detector 80 may be part of a DLL (e.g., the DLL 28 suitably modified to include the detector 80), which, as discussed before, is one type of synchronous circuit that can be internal to any integrated circuit including, for example, an SDRAM memory unit. Further, although the discussion given hereinbefore is with reference to a DLL, the coarse phase detector 80 of the present disclosure may be used with any other synchronous circuit including, for example, a synchronous mirror delay circuit (SMD) that may also be used for clock synchronization in various electronic integrated circuits including, for example, SDRAMs.

Figure 19:
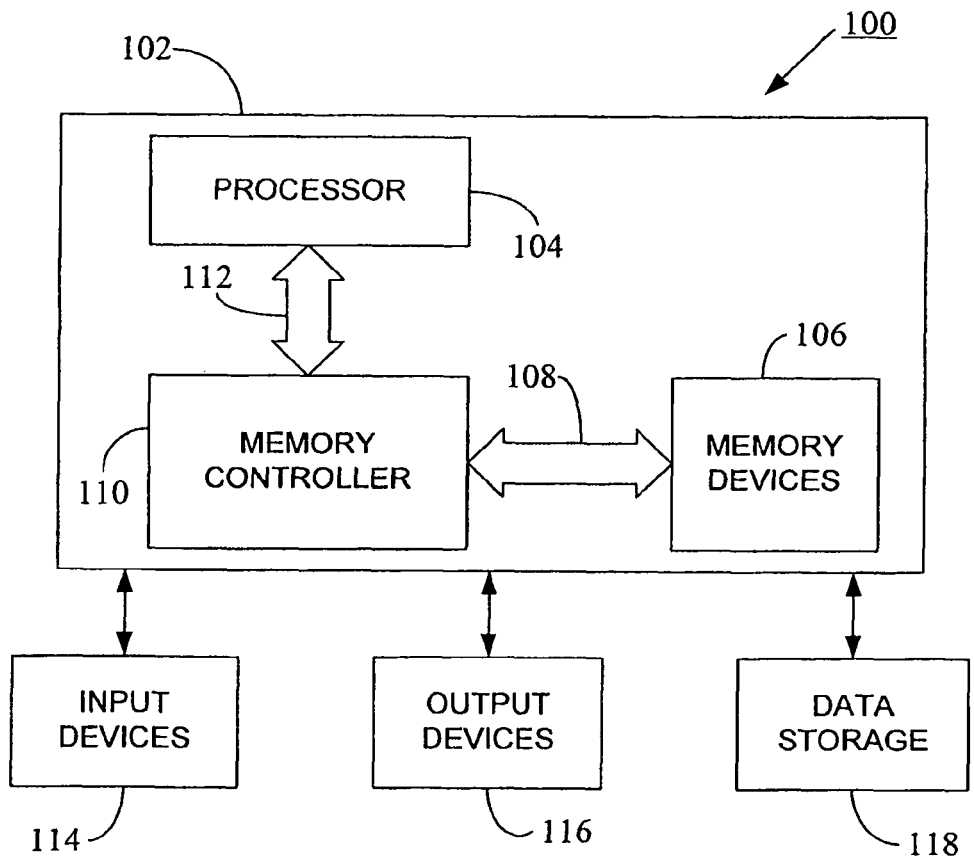
FIG. 19 is a block diagram depicting a system in which a coarse phase detector constructed according to the teachings of the present disclosure may be used.

FIG. 19 is a block diagram depicting a system 100 in which a coarse phase detector (e.g., the detector 80 in FIG. 15) constructed according to the teachings of the present disclosure may be used. The system 100 may include a data processing unit or computing unit 102 that includes a processor 104 for performing various computing functions, such as executing specific software to perform specific calculations or data processing tasks. The computing unit 102 may also include memory devices 106 that are in communication with the processor 104 through a bus 108. The bus 108 may include an address bus (not shown), a data bus (not shown), and a control bus (not shown). Each of the memory device 106 can be a dynamic random access memory (DRAM) chip or another type of memory circuits such as SRAM (Static Random Access Memory) chip or Flash memory. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that a memory device 106 of FIG. 19 is simplified to illustrate one embodiment of a memory device and is not intended to be a detailed illustration of all of the features of a typical memory chip. The processor 104 can perform a plurality of functions based on information and data stored in the memory devices 106. The processor 104 can be a microprocessor, digital signal processor, embedded processor, microcontroller, dedicated memory test chip, or the like.

Figure 5:
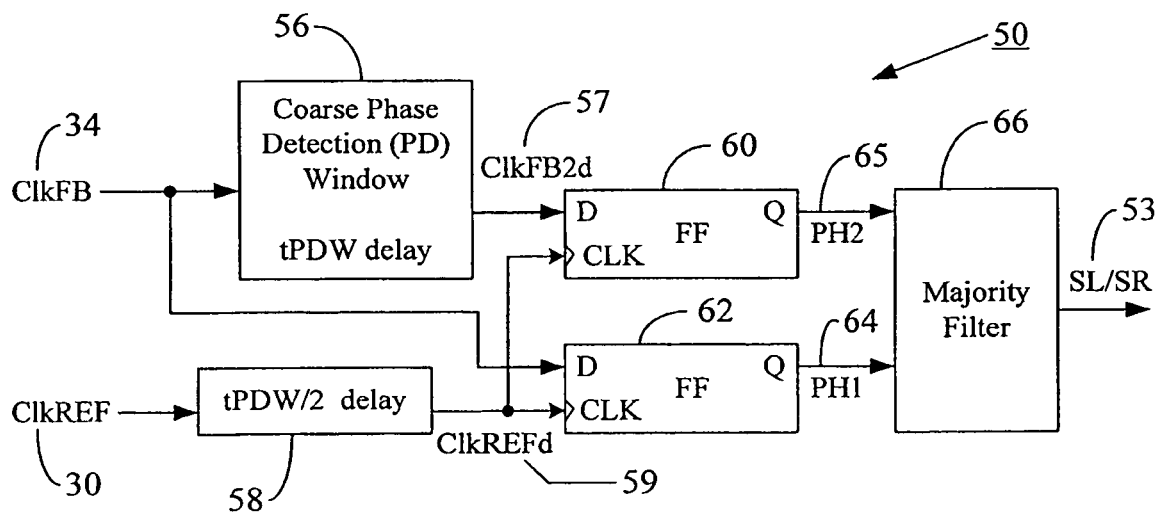
FIG. 5 shows an exemplary block diagram depicting various circuit elements constituting the coarse phase detector depicted in FIG. 4.

Each of the memory devices 106 may have construction similar to that shown in FIG. 1, with the exception that the DLL unit 28 may include the coarse phase detector 80 of FIG. 15 instead of the prior art coarse phase detector 50 shown in FIG. 5. A memory controller 110 controls data communication to and from the memory devices 106 in response to control signals (not shown) received from the processor 104 over the bus 112. The memory controller 110 may include a command decode circuit (not shown). The command decode circuit may receive the input control signals (on the bus 112) (not shown) to determine the modes of operation of one or more of the memory devices 106. Some examples of the input signals or control signals (not shown in FIG. 19) on the bus 112 (and also on the bus 108) include an External Clock signal, a Chip Select signal, a Row Access Strobe signal, a Column Access Strobe signal, a Write Enable signal, etc.

The system 100 may include one or more input devices 114 (e.g., a keyboard, a mouse, etc.) connected to the computing unit 102 to allow a user to manually input data, instructions, etc., to operate the computing unit 102. One or more output devices 116 connected to the computing unit 102 may also be provided as part of the system 100 to display or otherwise output data generated by the processor 104. Examples of output devices 116 include printers, video terminals or video display units (VDUs). In one embodiment, the system 100 also includes one or more data storage devices 118 connected to the data processing unit 102 to allow the processor 104 to store data in or retrieve data from internal or external storage media (not shown). Examples of typical data storage devices 118 include drives that accept hard and floppy disks, CD-ROMs (compact disk read-only memories), and tape cassettes.

The foregoing describes a system and method to generate and terminate clock shift modes during initialization of a synchronous circuit (e.g., a delay-locked loop or DLL). Upon initialization, the DLL is entered into a ForceSL (Force Shift Left) mode and an On1x mode (i.e., left shifting on each clock cycle). The feedback clock that tracks the phase of the reference clock (which, in turn, is derived from the system clock) is initially delayed in a coarse phase detector prior to applying it to the coarse phase detection window. Two delayed versions of the feedback clock are sampled by the reference clock to generate a pair of phase information signals, which are then used to establish an advanced phase equal (APHEQ) signal. The APHEQ signal advances onset of the PHEQ (phase equalization) phase and is used to terminate the ForceSL and On1x modes, thereby preventing wrong ForceSL exit due to clock jitter or feedback path overshooting during On1x exit. The avoidance of wrong ForceSL exit and On1x overshooting problems further results in faster DLL locking time.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a synchronous circuit, comprising:
applying a reference clock as an input to a delay line to obtain a feedback clock at an output of said delay line; and
obtaining a first delayed feedback clock by delaying said feedback clock by a first delay only during a shift mode in which a delay of the delay line is forced to change in only one direction;
obtaining a second delayed feedback clock from said feedback clock; and
when not in the shift mode, generating a shift signal to control the delay of said delay line based on a relationship among the respective phases of said reference clock, said first delayed feedback clock, and said second delayed feedback clock.

2. The method of claim 1, wherein obtaining said second delayed feedback clocks includes:
delaying said first feedback clock with a second delay to obtain said second delayed feedback clock.

3. The method of claim 2, further comprising:
delaying said reference clock with a third delay to obtain a delayed reference clock,
and wherein generating said shift signal comprises generating said shift signal based on a relationship among the respective phases of said delayed reference clock, said first delayed feedback clock, and said second delayed feedback clock.

4. The method of claim 3, wherein the amount of said third delay is half of the amount of said second delay.

5. The method of claim 3, further comprising:
sampling said first delayed feedback clock at a rising edge of said delayed reference clock to generate a first logic value;
sampling said second delayed feedback clock at said rising edge of said delayed reference clock to generate a second logic value; and
delaying said feedback clock by a first delay in the upon initialization of said synchronous circuit only as long as both of said first and said second logic values are both the same.

6. The method of claim 5, further comprising:
terminating the shift mode to terminate the delay of said feedback clock by a first delay responsive to an occurrence of said second logic value becoming different than said first logic value.

7. The method of claim 5, wherein generating said shift signal comprises generating said shift signal to increase the delay of said delay line upon initialization of said synchronous circuit so long as both of said first and said second logic values are the same.

8. The method of claim 7, further comprising:
discontinuing said shift signal responsive to an occurrence of said second logic value becoming different than said first logic value.

9. The method of claim 1, wherein the delay of the delay line is forced to change in a direction so as to increase the amount of delay imparted by said delay line during the shift mode.

10. A method of operating a synchronous circuit, comprising:
delaying a reference clock to obtain a feedback clock;
during an initialization mode of said synchronous circuit, forcing the delay of said reference clock to change in only one direction regardless of the respective relationships among the phases of said reference clock and said feedback clock;
delaying said feedback clock to obtain a first delayed feedback clock only during said initialization mode;
at a conclusion of said initialization mode, discontinuing delaying said feedback clock to obtain said first delayed feedback clock;
obtaining a second delayed feedback clock from said feedback clock; and
at a conclusion of said initialization mode, controlling the delay of said reference clock to obtain said feedback clock based on a relationship among the phases of said reference clock, said first delayed feedback clock, and said second delayed feedback clock.

11. The method of claim 10, further comprising:
determining a phase relationship between said reference clock and said first delayed feedback clock by sampling said first delayed feedback clock with said reference clock; and
continuing said initialization mode so long as a first phase relationship between said reference clock and said first delayed feedback clock is determined to exist.

12. A method of operating a synchronous circuit, comprising:
delaying a reference clock to provide a feedback clock;
during an initialization mode, delaying said feedback clock by a first delay to obtain a first delayed feedback clock;
during the initialization mode, obtaining a second delayed feedback signal by delaying the first delayed feedback signal;
when not in the initialization mode, obtaining the second delayed feedback signal by delaying the feedback signal;
during the initialization mode, changing the delay of the reference clock in a first direction to provide the feedback clock regardless of respective relationships among the phases of said reference clock, said first delayed feedback clock, and said second delayed feedback clock; and
when not in the initialization mode, controlling the delay of the reference clock to provide the feedback clock based on a relationship among the phases of said reference clock, said feedback clock, and said second delayed feedback clock.

13. The method of claim 12, further comprising:
sampling said first delayed feedback clock using said reference clock to generate a first logic value;
further sampling said second delayed feedback clock using said reference clock to generate a second logic value; and
continuing the initialization mode so long as both of said first and said second logic values are the same.

14. The method of claim 13, further comprising:
discontinuing the initialization mode responsive to said second logic value becoming different from said first logic value.

15. A method, comprising:
obtaining a reference clock;
generating a feedback clock from said reference clock, wherein frequencies of said feedback clock and said reference clock are identical;
obtaining a first delayed feedback clock and a second delayed feedback clock from said feedback clock;
advancing or retarding a timing of said feedback clock relative to said reference clock based on a relationship among the phases of said reference clock, said first delayed feedback clock, and said second delayed feedback clock;
entering a first mode to force said feedback clock to be delayed by a delay equal to a feedback path delay relative to said reference clock regardless of the relationship among the phases of said reference clock, said first delayed feedback clock, and said second delayed feedback clock;
entering a second mode to further delay said feedback clock relative to said reference clock on each clock cycle of said reference clock regardless of the relationship among the phases of said reference clock, said first delayed feedback clock, and said second delayed feedback clock;

monitoring the relationship among the phases of said reference clock, said first delayed feedback clock, and said second delayed feedback clock after entering said first and said second modes; and exiting said first and said second modes based on a phase relationship between said reference clock and said first delayed feedback clock.

16. The method of claim 15 wherein said exiting comprises:

exiting said first mode when a first phase relationship between said reference clock and said first delayed feedback clock has a first logic value and a second phase relationship between said reference clock and said second delayed feedback clock reaches a second logic value for the first time; and exiting said second mode when said first phase relationship has said first logic value and said second phase relationship again reaches said second logic value.

17. The method of claim 15 wherein said exiting comprises:

exiting said first and said second modes when a first phase relationship between said reference clock and said first delayed feedback clock has a first logic value and a second phase relationship between said reference clock and said second delayed feedback clock reaches a second logic value.

18. The method of claim 15 wherein said obtaining a first delayed feedback clock and a second delayed feedback clock comprises:

selecting said feedback clock that is delayed by a first delay relative to said reference clock during a first shift mode and selecting said feedback clock that bypasses said first delay during when said first mode is not active.

19. A synchronous circuit, comprising:

a delay line for receiving a reference clock and for generating a feedback clock therefrom; and a phase detector coupled to said delay line for receiving said feedback clock and for generating a first delayed feedback clock and a second delayed feedback clock from the feedback clock, wherein said phase detector is configured to also receive said reference clock and to generate a shift signal based on a relationship among the phases of said reference clock, said first delayed feedback clock, and said second delayed feedback clock, wherein said phase detector is further configured to input said shift signal to said delay line so as to enable said delay line to shift said reference clock to increase or decrease the delay based on said shift signal, said phase detector comprising a controlled delay unit configured to select between applying a delay unit to said feedback clock to generate said first delayed feedback clock during a shift mode where the reference clock is forced to shift in only one direction and bypassing said delay unit during an operation mode where the reference clock is not forced to shift in only said one direction to generate said first delayed feedback clock.

20. The circuit of claim 19, wherein said phase detector further comprises:

a first reference clock delay unit to provide a first delay to said reference clock, thereby generating a delayed reference clock; and another delay unit to provide a third delay to said first delayed feedback clock, thereby generating said second delayed feedback clock.

21. The circuit of claim 20, wherein said delay of said first reference clock delay unit is half of said delay of said another delay unit.

22. The circuit of claim 20, wherein said delay of said first reference clock delay unit and said delay of said another delay unit are fixed, and wherein said delay of said delay unit is variable.

23. The circuit of claim 20, wherein said controlled delay unit is configured to receive said feedback clock and a control signal as inputs thereto and for generating said first delayed feedback clock at an output thereof, wherein said second delay unit includes a plurality of delay units, and wherein said controlled delay unit is configured to apply said feedback clock to said second delay unit when said control signal is active, and wherein said controlled delay unit is further configured to prevent application of said feedback clock to said second delay unit when said control signal is inactive.

24. The circuit of claim 19, wherein said phase detector further comprises:

a first sampler circuit for sampling said first delayed feedback clock using said reference clock, thereby generating a first phase relation signal;

a second sampler circuit for sampling said second delayed feedback clock using said delayed reference clock, thereby generating a second phase relation signal; and a shift signal generator coupled to said first and said second sampler circuits for generating said shift signal from said first and said second phase relation signals.

25. The circuit of claim 24, wherein said phase detector further comprises:

a control unit coupled to said shift signal generator for receiving said first and said second phase relation signals and for generating a control signal therefrom; and wherein said controlled delay unit is configured to receive said control signal and is further configured to receive said feedback clock from said delay line, wherein said controlled delay unit is configured to apply said second delay unit to said feedback clock to generate said first delayed feedback clock when said control signal is active, and to bypass said second delay unit to generate said first delayed feedback clock when said control signal is inactive.

26. The circuit of claim 25, wherein said control unit is configured to generate said control signal upon initialization of said synchronous circuit, and wherein said control circuit is further configured to terminate generation of said control signal when said first phase relation signal has a first logic value and said second phase relation, signal achieves a different logic value for the first time after said initialization of said synchronous circuit.

27. The circuit of claim 25, wherein said control unit is configured to generate said control signal upon initialization of said synchronous circuit, and wherein said phase detector is configured to supply said control signal to said delay line upon said initialization so as to enable said delay line to shift said reference clock in one direction regardless of the relationship among the phases of said reference clock, said first delayed feedback clock, and said second delayed feedback clock.

28. A combination, comprising:

a plurality of memory cells for storing data; and a delay locked loop configured to provide a clock signal to facilitate a data read/write operation at one or more of said plurality of memory cells, wherein said delay locked loop comprises:

a delay line for receiving a reference clock and for generating said clock signal therefrom, and a phase detector coupled to said delay line for receiving said clock signal and for generating a first delayed clock and a second delayed clock therefrom, wherein said phase detector is configured to also receive said reference clock and to generate a shift signal based on a relationship among the phases of said reference clock, said first delayed clock, and said second delayed clock, wherein said phase detector is further configured to input said shift signal to said delay line so as to enable said delay line to shift said reference clock leftward or rightward based on said shift signal, said phase detector comprising a controlled delay unit configured to select between applying a delay unit to said feedback clock to generate said first delayed feedback clock during a shift mode where the reference clock is forced to shift in only one direction and bypassing said delay unit during an operation mode where the reference clock is not forced to shift in only said one direction to generate said first delayed feedback clock.

29. A system, comprising:

a processor;

a bus; and a memory device coupled to said processor via said bus, wherein said memory device comprises:

a synchronous circuit having:

a delay line for receiving a reference clock and for generating a feedback clock therefrom, and a phase detector coupled to said delay line for receiving said feedback clock and for generating a first delayed clock and a second delayed clock therefrom, wherein said phase detector is configured to also receive said reference clock and to generate a shift signal based on a relationship among the phases of said reference clock, said first delayed clock, and said second delayed clock, wherein said phase detector is further configured to input said shift signal to said delay line so as to enable said delay line to shift said reference clock leftward or rightward based on said shift signal, said phase detector comprising a controlled delay unit configured to select between applying a delay unit to said feedback clock to generate said first delayed feedback clock during a shift mode where the reference clock is forced to shift in only one direction and bypassing said delay unit during an operation mode where the reference clock is not forced to shift in only said one direction to generate said first delayed feedback clock.

* * * * *